United States Patent
Blomberg et al.

(10) Patent No.: US 9,618,244 B2
(45) Date of Patent: Apr. 11, 2017

(54) POWER ELECTRONICS COOLING

(71) Applicant: ABB TECHNOLOGY AG, Zürich (CH)

(72) Inventors: Anders Blomberg, Västerås (SE); Bruno Agostini, Zürich (CH); Jing Ni, Ludvika (SE); Jürgen Hafner, Ludvika (SE); Mathieu Habert, Rheinfelden (CH)

(73) Assignee: ABB Schweiz AG, Baden (CH)

( * ) Notice: Subject to any disclaimer, the term of this patent is extended or adjusted under 35 U.S.C. 154(b) by 287 days.

(21) Appl. No.: 14/636,391

(22) Filed: Mar. 3, 2015

(65) Prior Publication Data
US 2015/0241094 A1   Aug. 27, 2015

Related U.S. Application Data

(63) Continuation of application No. PCT/EP2013/067826, filed on Aug. 28, 2013.

(30) Foreign Application Priority Data

Sep. 3, 2012 (EP) .................................... 12182709

(51) Int. Cl.
*F25B 39/02* (2006.01)
*F28F 7/02* (2006.01)
(Continued)

(52) U.S. Cl.
CPC .......... *F25B 39/02* (2013.01); *F28D 15/0266* (2013.01); *F28F 7/02* (2013.01);
(Continued)

(58) Field of Classification Search
CPC ................ F25B 23/02; F25B 2339/023; F25B 2339/022; F28F 9/001; F28F 9/22
See application file for complete search history.

(56) References Cited

U.S. PATENT DOCUMENTS

| 4,745,965 A | 5/1988 | Katsura et al. |
| 5,966,957 A | 10/1999 | Malhammar et al. |

(Continued)

FOREIGN PATENT DOCUMENTS

| EP | 1143778 A1 | 10/2001 |
| EP | 2282624 A1 | 2/2011 |

(Continued)

OTHER PUBLICATIONS

International Search Report (PCT/ISA/210) mailed on May 16, 2014, by the European Patent Office as the International Searching Authority for International Application No. PCT/EP2013/067826.

(Continued)

*Primary Examiner* — Cassey D Bauer
(74) *Attorney, Agent, or Firm* — Taft Stettinius & Hollister LLP

(57) ABSTRACT

An exemplary evaporating unit for cooling a heat emitting device includes a cooling circuit having a stack of evaporating units arranged alternately with heat emitting devices. Each evaporating unit is connected to a condenser and includes a first inlet channel, a first plurality of evaporation channels, and a first outlet channel. The evaporating unit is designed for pre-heating the cooling fluid flowing therein.

16 Claims, 9 Drawing Sheets

(51) Int. Cl.
   *F28D 15/02* (2006.01)
   *H01L 23/40* (2006.01)
   *H01L 23/427* (2006.01)
   *F28F 9/00* (2006.01)
   *F28F 9/22* (2006.01)

(52) U.S. Cl.
   CPC ............... *F28F 9/001* (2013.01); *F28F 9/22* (2013.01); *H01L 23/4012* (2013.01); *H01L 23/427* (2013.01); *H01L 2924/0002* (2013.01)

(56) References Cited

U.S. PATENT DOCUMENTS

| 2002/0007641 | A1 | 1/2002 | Marsala |
| 2003/0061824 | A1 | 4/2003 | Marsala |
| 2006/0011326 | A1* | 1/2006 | Yuval ................... F28D 1/0475 165/80.4 |
| 2007/0188994 | A1 | 8/2007 | Tsai |
| 2011/0030400 | A1 | 2/2011 | Agostini et al. |
| 2012/0043060 | A1* | 2/2012 | Wang ................... F28D 15/0266 165/104.26 |
| 2012/0087090 | A1* | 4/2012 | Feng ................... F28D 15/0233 361/700 |

FOREIGN PATENT DOCUMENTS

| EP | 2431701 A1 | 3/2012 |
| GB | 2173413 A | 10/1986 |
| WO | WO 96/29553 A1 | 9/1996 |

OTHER PUBLICATIONS

European Search Report mailed on Feb. 11, 2013 for European Application No. 12182709.1.

International Preliminary Report on Patentability (PCT/IPEA/409) mailed on Jan. 15, 2015, by the European Patent Office as the International Examining Authority for International Application No. PCT/EP2013/067826.

* cited by examiner

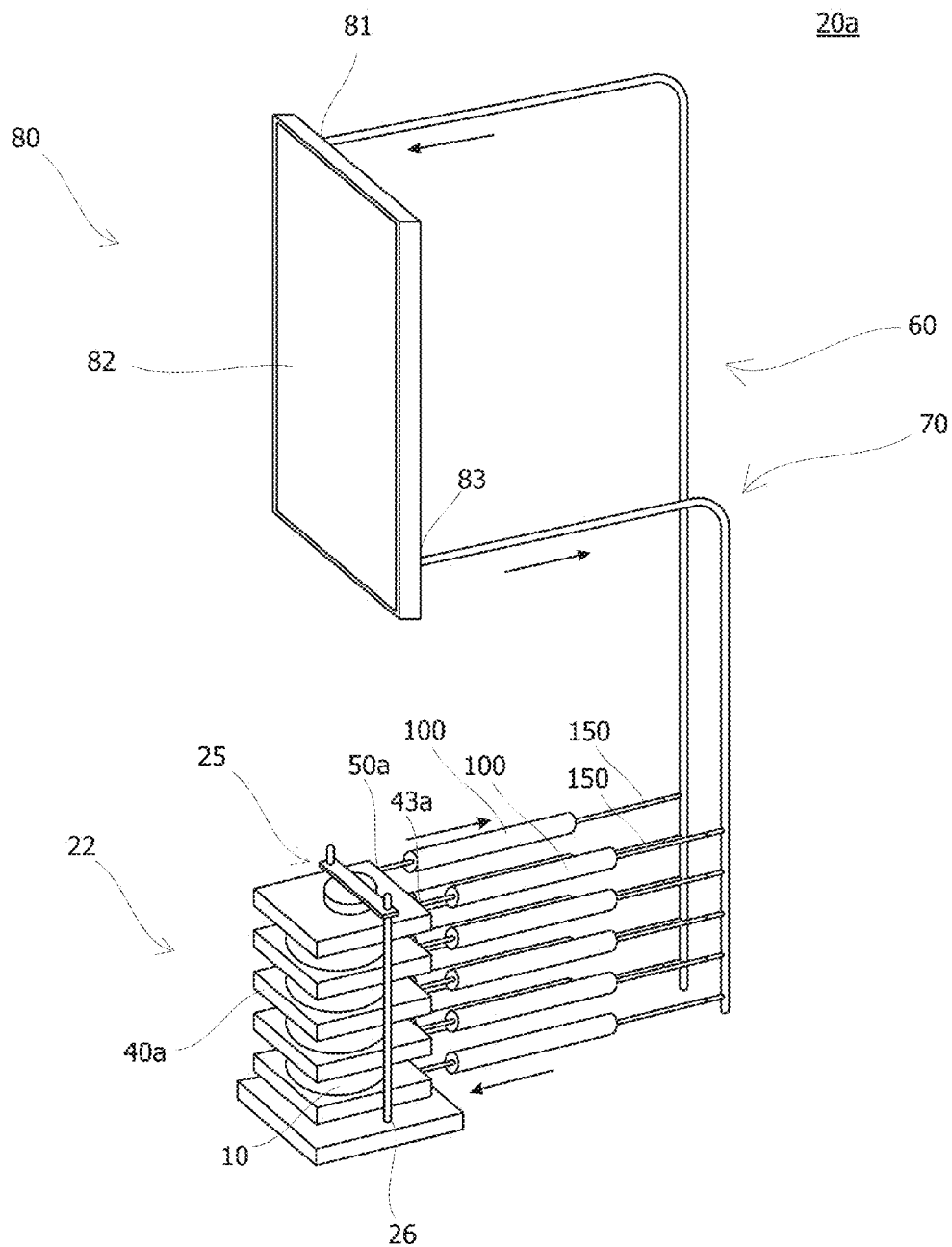

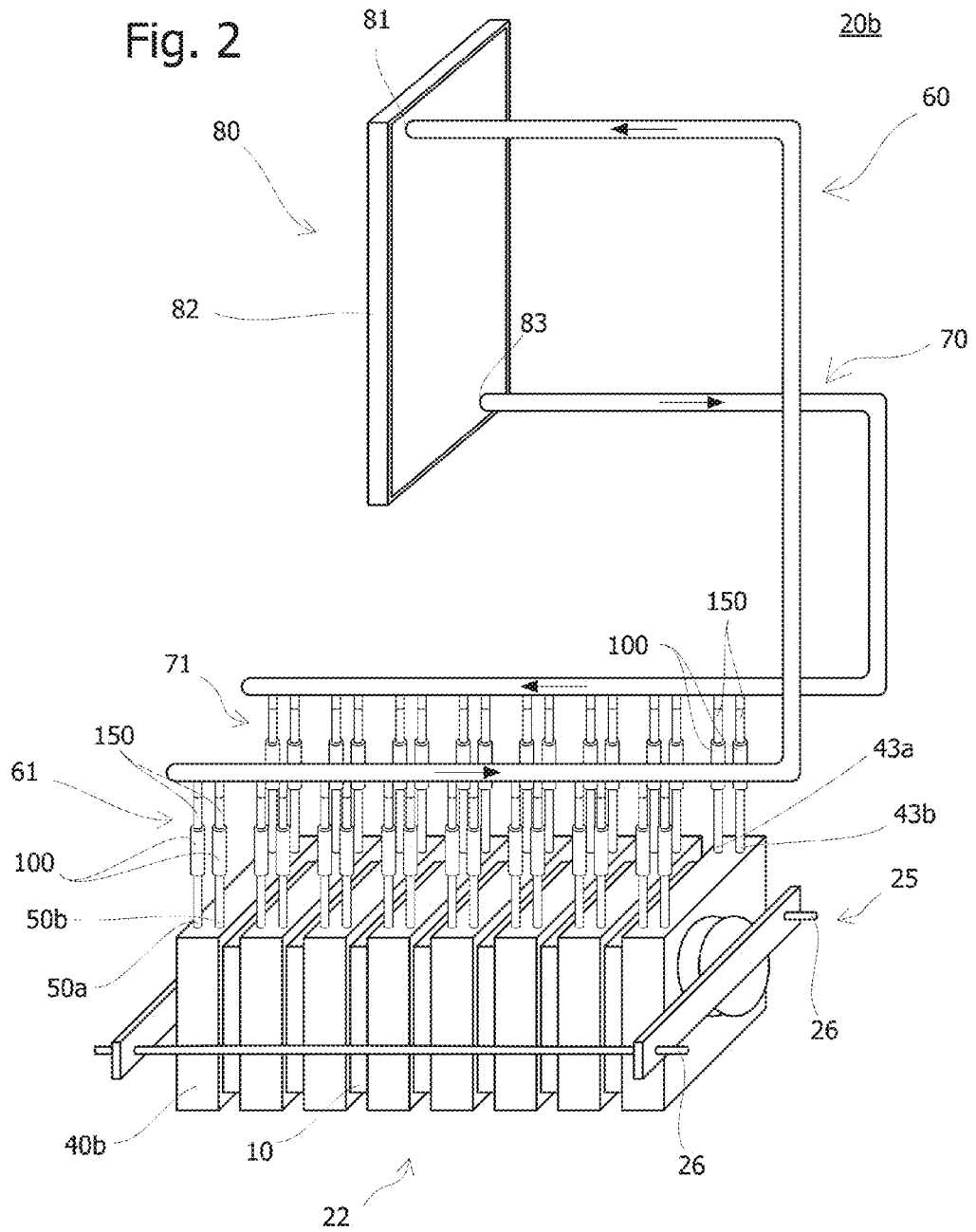

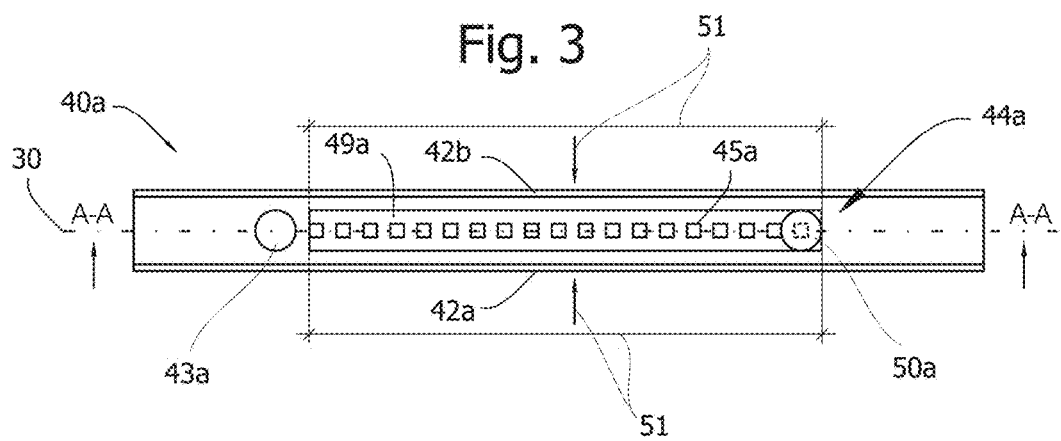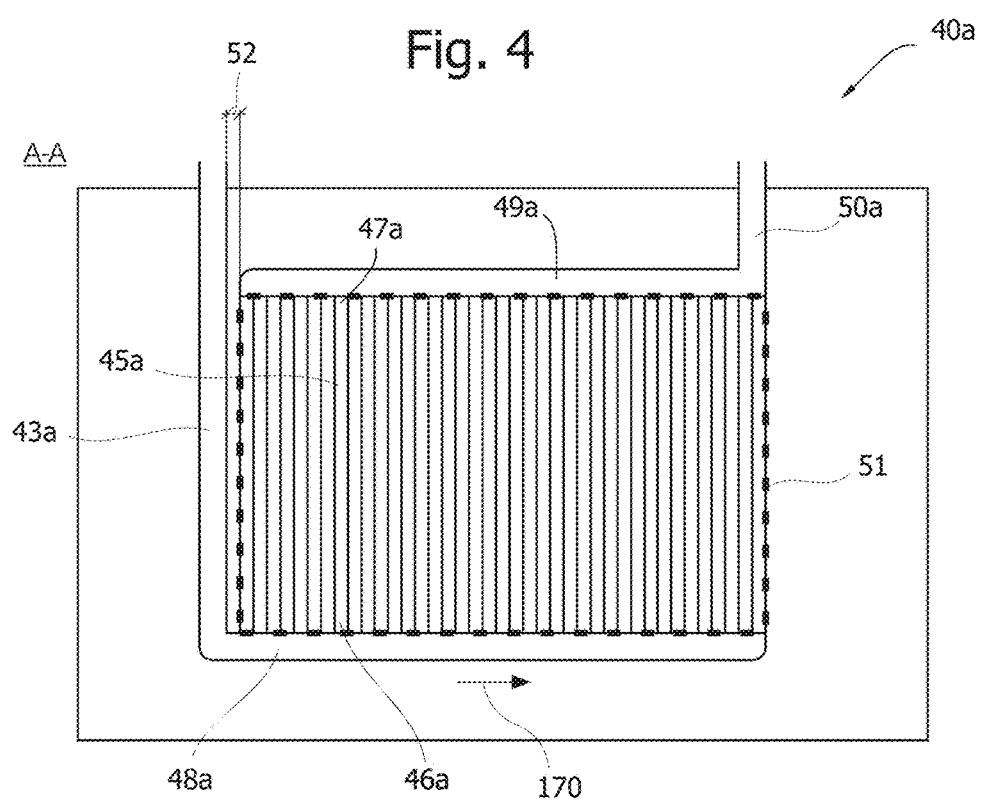

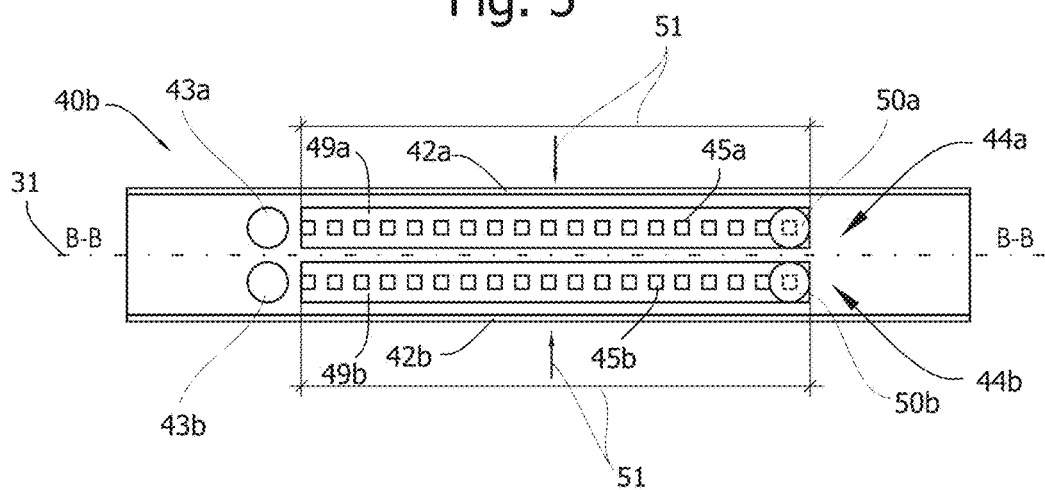
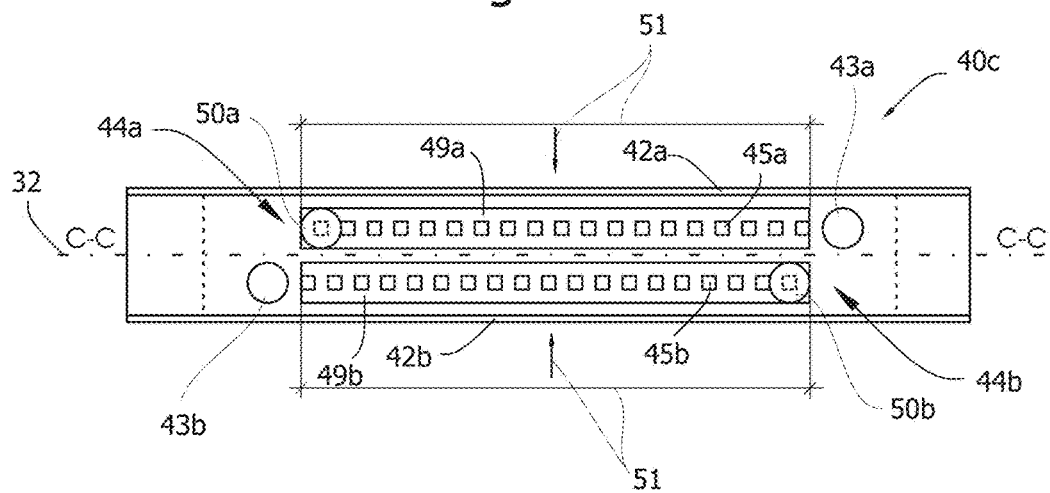

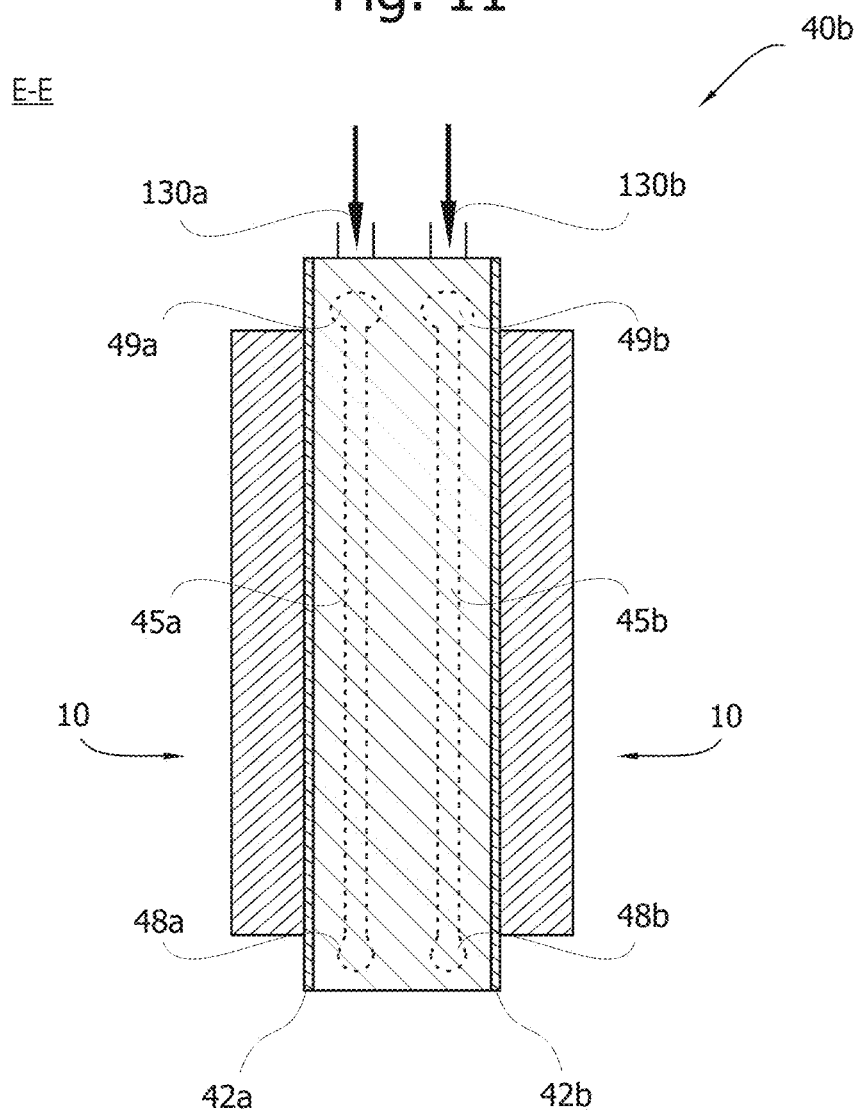

POWER ELECTRONICS COOLING

RELATED APPLICATION(S)

This application claim priority under 35 U.S.C. §120 to International application PCT/EP2013/067826 filed on Aug. 28, 2013, designating the U.S., and claiming priority to European application 12182709.1 filed in Europe on Sep. 3, 2012. The content of each prior application is hereby incorporated by reference in its entirety.

FIELD

The subject matter described herein relates to cooling systems for power modules. For example, the subject matter relates to evaporators or two-phase coolers for electronic components, to cooling systems using such evaporators and to methods for cooling of electronic components such as, power semiconductors.

BACKGROUND INFORMATION

Cooling is can be an important aspect in the design of any electrical product, such as IGBT (insulated gate bipolar transistor) based products, e.g., DC-breakers, as heat is inevitably generated by the current flowing through the electrical circuits. In recent years there has been a tendency of power electronic devices to reach larger and larger power values. This increase in power can be directly related to an increase in thermal energy dissipated by the power electronic devices. However, because power electronic devices still remain vulnerable to thermal problems more efficient cooling systems would be useful.

The further trend towards achieving higher power densities, which results in more compact power electronic devices being able to handle an equal or larger amount of power than before, as well as less space for the cooling system and for the air flow, pose continuous challenges to the design and cooling performance of the employed cooling systems.

Moreover, it is desired that cooling systems for modern electrical products have higher performance at a lower price.

At present, one way of providing an efficient cooling system for power electronic devices, such as IGBT (insulated gate bipolar transistor) based DC-breakers, is to provide a two-phase cooling circuit. Such a cooling circuit brings a liquid into thermal contact with the heat emitting device via an evaporating unit. The liquid is heated inside of the evaporating unit by the dissipated heat from the heat emitting device and reaches a boiling temperature. As the temperature of the liquid will not rise above the boiling temperature, the temperature of the liquid and therefore the temperature of the heat emitting device is kept at a temperature of the boiling point of the liquid as a maximum. The vapour of the liquid is then guided through a vapour riser pipe system to a condenser. Within the condenser the vapour is changed into a liquid by emitting heat. For example, in the condenser the heat is emitted to a coolant medium, such as air at ambient temperature. The vapour thus returns to its liquid phase. The condenser and the evaporating unit are connected via a liquid downcomer pipe system such that the condensed vapour is fed back to the evaporating unit as a liquid. Such a two-phase cooling system is, for instance, disclosed in EP 2 282 624, the entire content of which is incorporated herein by reference.

Two-phase cooling circuits provide increased cooling performance. However, due to the limited life-span and thermal vulnerability of power electronic devices improved two-phase cooling circuits can be useful, where improvements are directed to cooling efficiency. Further, due to the competitive nature of the market for such cooling circuits, increasing cooling efficiency at the same or a reduced cost is desired.

SUMMARY

An exemplary stack of a plurality of alternating heat emitting devices and evaporating units is dislcosed, wherein the heat emitting devices include power electronic components, and wherein an evaporating unit is arranged for cooling at least one heat emitting device by evaporation of a cooling fluid, the evaporating unit comprising: at least one thermo-conducting wall that is thermally connectable to the at least one heat emitting device; a first inlet channel adapted for receiving the condensed cooling fluid from a condenser; a first fluid distributor fluidly connected to the first inlet channel for receiving the cooling fluid therefrom, and having a volume for collecting the cooling fluid therein; a first plurality of evaporation channels each having a first end and a second end, the first ends being fluidly connected to the first fluid distributor for receiving the cooling fluid therefrom, the first plurality of evaporation channels being in thermal contact with the at least one thermo-conducting wall such that in an operating state the cooling fluid is heated in the first plurality of evaporation channels by the heat from the at least one heat emitting device and thereby at least partially vaporized and driven out from the first plurality of evaporation channels at their second ends; a first fluid collector fluidly connected to the second ends of the first plurality of evaporation channels for receiving the evaporated cooling fluid therefrom, and having a volume for collecting the evaporated cooling fluid therein; a first outlet channel fluidly connected to the first fluid collector and adapted for receiving the evaporated cooling fluid therefrom, wherein the at least one thermo-conducting wall has a cooling surface portion, the cooling surface portion being a minimum convex surface portion enclosing all projections of the first plurality of evaporation channels onto the at least one thermo-conducting wall, and wherein the first inlet channel is positioned in the evaporating unit such that its projection on the at least one thermo-conducting wall is situated outside the cooling surface portion, such that in an operating state the cooling fluid inside of the first inlet channel is pre-heated by the at least one heat emitting device before entering the fluid collector.

An exemplary method for cooling at least one heat emitting device by at least one evaporating unit is disclosed, the at least one evaporating unit including at least one thermo-conducting wall, a first inlet channel, a first fluid distributor, a first plurality of evaporation channels, a first fluid collector, and a first outlet channel, wherein the at least one heat emitting device is connected to the at least one thermo-conducting wall at a cooling surface portion of the at least one evaporating unit forming a contact region there between, and wherein the first inlet channel is positioned in the at least one evaporating unit such that its projection on the at least one thermo-conducting wall is situated outside of said contact region, the method comprising: transferring heat from the at least one heat emitting device via the at least one thermo-conducting wall to the first inlet channel so that the cooling fluid inside of the first inlet channel is pre-heated by the at least one heat emitting device before entering the first fluid distributor; transferring heat from the at least one heat emitting device via the at least one thermo-conducting wall to the first plurality of evaporation channels; and boiling of the liquid cooling fluid in the first plurality of evaporation channels, so that the cooling fluid therein is at least partially vaporized, thereby displaced out from the first plurality of evaporation channels to the first fluid collector and replaced by liquid cooling fluid entering the first plurality of evaporation channels from the first fluid distributor.

BRIEF DESCRIPTION OF THE DRAWINGS

A full and enabling disclosure including the best mode thereof is set forth more particularly in the remainder of the specification, including reference to the accompanying figures wherein:

FIG. 1 and FIG. 2 schematically show perspective views of cooling circuits according to exemplary embodiments of the present disclosure;

FIG. 3 schematically shows a top view of an evaporating unit according to an exemplary embodiment of the present disclosure;

FIG. 4 schematically shows a cross-section along plane A-A of the evaporating unit shown in FIG. 3 according to an exemplary embodiment of the present disclosure;

FIG. 5 schematically shows a top view of an evaporating unit according to an exemplary embodiment of the present disclosure;

FIG. 6 schematically shows a top view of an evaporating unit according to an exemplary embodiment of the present disclosure;

FIG. 11 schematically shows a cross-section along plane E-E of the evaporating unit shown in FIG. 10 according to an exemplary embodiment of the present disclosure.

DETAILED DESCRIPTION

Figure 7:
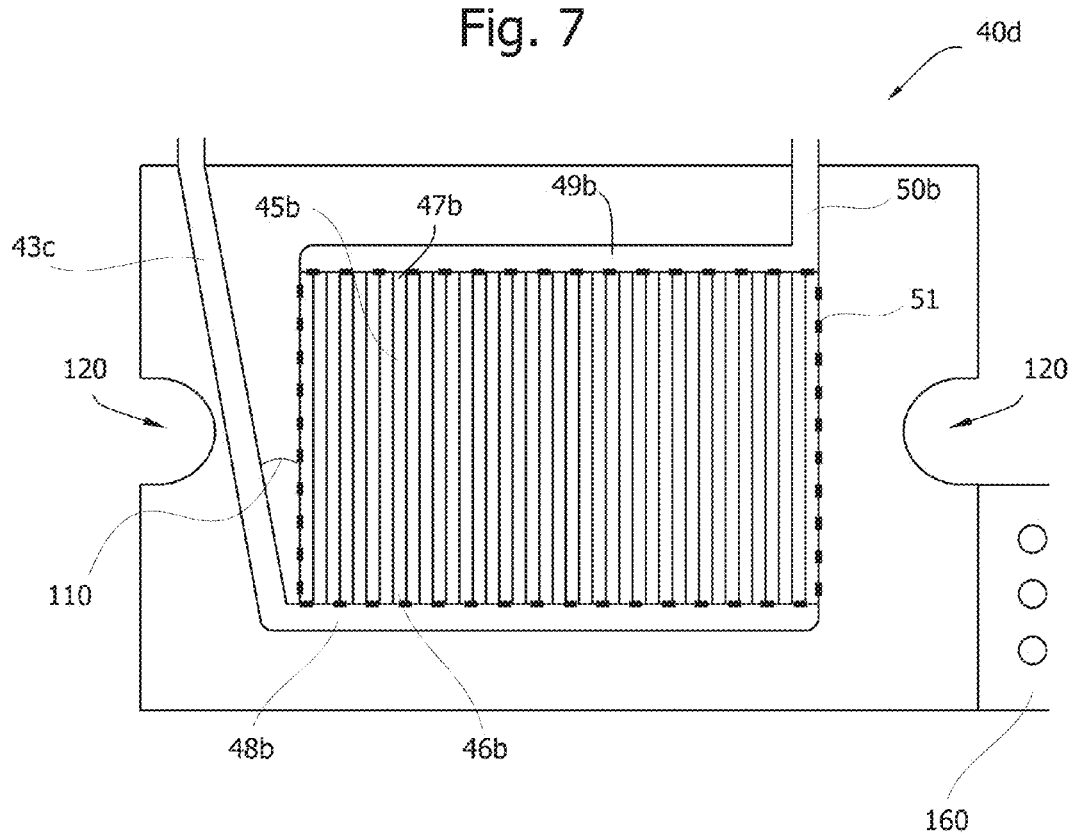
FIG. 7 schematically shows a cross-section of an evaporating unit according to an exemplary embodiment of the present disclosure.

According to an exemplary embodiment of the present disclosure, an evaporating unit for cooling at least one heat emitting device by evaporation of a cooling fluid is provided. The evaporating unit includes a thermo-conducting wall that is thermally connectable to the at least one heat emitting device. A first inlet channel adapted for receiving the condensed cooling fluid from a condenser. A first fluid distributor fluidly connected to the first inlet channel for receiving the cooling fluid therefrom, and having a volume for collecting the cooling fluid therein. A first plurality of evaporation channels each having a first end and a second end, the first ends being fluidly connected to the first fluid distributor for receiving the cooling fluid therefrom, the first plurality of evaporation channels being in thermal contact with the at least one thermo-conducting wall such that in an operating state the cooling fluid therein is heated in the first plurality of evaporation channels by the heat from the at least one heat emitting device and thereby at least partially vaporized and driven out from the first plurality of evaporation channels at their second ends. A first fluid collector fluidly connected to the second ends of the first plurality of evaporation channels for receiving the evaporated cooling fluid therefrom, and having a volume for collecting the evaporated cooling fluid therein and a first outlet channel fluidly connected to the first fluid collector and adapted for receiving the evaporated cooling fluid therefrom.

Further, the at least one thermo-conducting wall has a cooling surface portion defined as the minimum convex surface portion enclosing all projections of the plurality of evaporation channels onto the at least one thermo-conducting wall, and furthermore the first inlet channel is positioned in the evaporating unit such that its projection on the at least one thermo-conducting wall is situated outside the cooling surface portion, such that in the operating state the cooling fluid inside of the first inlet channel is pre-heated by the at least one heat emitting device before entering the fluid collector. In the context of the present disclosure, the first inlet channel is also simply referred to as "inlet channel".

According to another exemplary embodiment of the present disclosure, is directed to a use of the aforementioned evaporating unit for pre-heating the cooling fluid in the inlet channel at least to −5° C. from its liquid-gas phase transition point. According to yet another exemplary embodiment disclosed herein, the evaporating unit includes two thermo-conducting walls provided on mutually opposite sides of the evaporating unit and are adapted to be in thermal contact with two heat emitting devices, specifically, with two neighboring heat emitting devices of a stack including heat emitting devices and evaporating units in alternation (e.g., alternately disposed).

According to another exemplary embodiment of the present disclosure, a cooling circuit for cooling at least one heat emitting device by evaporation of a cooling fluid is provided. The cooling circuit includes at least one evaporating unit as described above. A condenser having a coupling portion for thermally coupling the condenser to a heat sink and a pipe system including a vapour riser pipe system connecting the first outlet channel to the condenser for delivering vaporous cooling fluid from the first outlet to the condenser in the operating state; and a liquid downcomer pipe system connecting the condenser to the first inlet channel for delivering liquid cooling fluid from the condenser to the first inlet channel in the operating state.

According to an exemplary embodiment of the present disclosure, a power electronic module includes at least one evaporating unit as described above and at least one heat emitting device that is thermally connected to the thermo-conducting wall of the at least one evaporating unit is provided.

According to yet another exemplary embodiment of the present disclosure, a method for cooling at least one heat emitting device by at least one evaporating unit, the at least one evaporating unit including at least one thermo-conducting wall, a first inlet channel, a first fluid distributor, a first plurality of evaporation channels, a first fluid collector and a first outlet channel is provided. The at least one heat emitting device is connected to the at least one thermo-conducting wall at a cooling surface portion of the at least one evaporating unit forming a contact region there between, and wherein the first inlet channel is positioned in the at least one evaporating unit such that its projection on the at least one thermo-conducting wall is situated outside of said contact region. The method includes transferring heat from the at least one heat emitting device via the at least one thermo-conducting wall to the first inlet channel so that the cooling fluid inside of the first inlet channel is pre-heated by the at least one heat emitting device before entering the first fluid distributor transferring heat from the at least one heat emitting device via the at least one thermo-conducting wall to the first plurality of evaporation channels, boiling of the liquid cooling fluid in the first plurality of evaporation channels, so that the cooling fluid therein is at least partially vaporized, thereby displaced out from the first plurality of evaporation channels to the first fluid collector and replaced by liquid cooling fluid entering the first plurality of evaporation channels from the first fluid distributor.

Further aspects, advantages and features of the present disclosure are apparent from the dependent claims, the description and the accompanying drawings.

Reference will now be made in detail to the various embodiments, one or more examples of which are illustrated in each figure. Each example is provided by way of explanation and is not meant as a limitation. For example, features and/or method steps illustrated or described as part of one embodiment and/or method can be used on or in conjunction with other exemplary embodiments and/or method steps to yield yet further exemplary embodiments or methods. It is intended that the present disclosure includes such modifications and variations.

Within the following description of the drawings, the same reference numbers refer to the same or to similar components. Only the differences with respect to the individual exemplary embodiments are described. Unless specified otherwise, the description of a part or aspect in one embodiment applies to a corresponding part or aspect in another embodiment as well.

Although specific features of various exemplary embodiments of the disclosure can be shown in some drawings and not in others, this is for convenience only. In accordance with the principles of the disclosure, any feature of a drawing can be referenced and/or claimed in combination with any feature of any other drawing.

Exemplary embodiments disclosed herein provide a reliable and efficient two-phase cooling system that includes an evaporating unit and a condenser fluidly connected to each other. Hence, the subject matter described herein pertains to methods and systems to remove heat from a heat emitting device more efficiently than it has been removed in the past. In exemplary embodiments described herein, an evaporating unit can transfer the absorbed thermal energy from a heat emitting device to a cooling fluid present inside of the evaporating unit's core(s). For example, the thermal energy is absorbed via a boiling or evaporative process of the cooling fluid inside of the aforesaid core(s) of the evaporating unit. The coolant fluid transfers the absorbed thermal energy to an external coolant via a condenser, thereafter it returns to the evaporating unit to once more absorb thermal energy from the heat emitting device.

According to known implementations, the assumption can be made that the lower the temperature of a cooling medium the better its cooling effect. Therefore, it is counter-intuitive and surprising that a pre-heated cooling fluid can improve the cooling efficiency of a cooling system as described with respect to the exemplary embodiments disclosed herein. In an exemplary cooling system of the present disclosure, the amount of thermal energy absorbed by the cooling fluid during its phase change, for instance, from a liquid to a gas is much greater than the amount of thermal energy used to raise the temperature of the same cooling fluid from a freezing point to a temperature slightly below its boiling point. In other words, in a two-phase cooling system, maintaining a cooling fluid close to its liquid-gas phase transition point actually provides an increased cooling efficiency due to the large amount of energy absorbed by the cooling fluid at the aforesaid liquid-gas phase transition point.

As a result of the exemplary embodiment described herein, as it relates to two-phase cooling circuits, if the cooling fluid returning to the evaporating unit from a condenser is cooled too far below its saturation temperature it can cause temperature non-uniformities in the evaporating unit. These temperature non-uniformities can cause undesirable hot spots in the core of the evaporating unit because of the substantially lower heat transfer coefficient associated with a sub-cooled liquid compared to a saturated cooling fluid. Consequenty, the cooling efficiency of the evaporating unit in the cooling circuit can be diminished and the hot spots can cause premature failure of the heat emitting device being cooled. To prevent such failures and improve cooling efficiency, it is desirable that the cooling fluid entering the core of the evaporating unit is approximately saturated. Hence, according to an exemplary embodiment of the present disclosure, the evaporating unit is dimensioned such that on entry into the evaporation channels, the cooling fluid is pre-heated to a temperature very close to its liquid-gas phase transition temperature, e.g. a temperature higher than 5° C. below the liquid-gas phase transition point, or even higher than 2° C. below the liquid-gas phase transition point. Nevertheless, in such an embodiment the cooling fluid should not come to a full boil within the pre-heating channel, as this could reduce the supply of fresh cooling fluid to the evaporating unit.

According to exemplary embodiments of the present disclosure, one option for ensuring that the cooling fluid entering the core of the evaporating unit is approximately saturated can be to design the evaporating unit in such a way that the inlet channel, which is guiding the cooling fluid to the core of the evaporating unit is disposed in proximity and along a portion of the core's outermost evaporation channels. Thereby, the thermal energy from the cooling fluid inside of the evaporation channels can be used to effectively pre-heat the cooling fluid before it enters the core of the evaporating unit. Thus, temperature non-uniformities and the formation of hot spots inside the core of the evaporating unit can be avoided.

Assembling an exemplalry evaporating unit according to the above-mentioned design calls for very little extra steps in the manufacturing process and is therefore a cost efficient solution for improving the cooling performance and reliability of evaporating units and cooling circuits. Moreover, because no additional pre-heating parts are necessary the evaporating unit can retain its compact configuration and the risk of failure by additional pre-heating parts is eliminated.

As used herein, the term "evaporating unit" is intended to be representative of any device that provides a cooling surface to remove thermal energy from heat emitting devices and that evaporates a cooling fluid therein. For example, the evaporating unit can also be denoted as "evaporator", "cooler", "two-phase-cooler" or "cold plate".

As used herein, the term "cooling circuit" is intended to be representative of a cooling fluid circuit that can include at least an evaporating unit and a condenser, which are in fluid communication with each other. Exemplary cooling circuits described herein can include passive heat exchange based on natural convection, which circulates a cooling fluid without using mechanical pumps, for example, in a hermetically closed-loop circuit. However, a motor driven pump can be used under certain circumstances to increase circulation of the cooling fluid within the cooling circuit.

As used herein, the term "condenser" is intended to be representative of any type of heat exchanger such as, for instance, a plate fin or phase-change heat exchanger or combinations thereof that is able to condense vapour into a liquid.

As used herein, the term "thermo-conducting wall" is intended to be representative of a portion of the evaporating unit that can provide a contact surface for cooling a heat emitting device. For example, a thermo-conducting wall can transfer the thermal energy from a heat emitting device to a cooling fluid inside of the evaporating unit.

As used herein, the term "power electronic module" is intended to be representative of a module, which includes at least one evaporating unit with at least one heat emitting device that is usually attached to the thermo-conducting wall of the evaporating unit. For example, the power electronic module also includes a condenser, and the evaporating unit is in fluid communication with the condenser thereby forming a cooling circuit. The power electronic module can further include any other elements of the evaporator or cooling circuit described herein. In exemplary embodiments of the power electronic module described herein, the at least one evaporating unit can include a plurality of evaporating units, the at least one heat emitting device can include a plurality of heat emitting devices, and the plurality of evaporating units and the plurality of heat emitting devices can be arranged as an alternating stack.

As used herein, the term "projections" is intended be representative of orthographic projections onto a two-dimensional projection surface (here, the plane defined by the thermo-conducting walls). For example, an orthographic projection can be a parallel projection where the projection rays are perpendicular to the projection plane. Hence, according to the exemplary embodiments herein, in an evaporating unit, the projection of an evaporation channel on a thermo-conducting wall can be viewed as being effected by projection rays from the inner volume of the evaporation channel that are perpendicular to the projection plane, which in this case is the substantially planar thermo-conducting wall. In other words, the projection can be viewed as an imaginary shadow cast on the thermo-conducting wall by parallel rays from the inner volume of the evaporation channels. Even in cases where the thermo-conducting wall (projection surface) is not completely planar, it can still define a projection plane, either by a best-fit plane or by a largest planar sub-plane.

As used herein, the term "cooling surface portion" is intended to be representative of a surface portion of the thermo-conducting wall, which is defined by the area of (orthographic) projections of the plurality of evaporation channels on the thermo-conducting wall. This area on the thermo-conducting wall can be described as the minimum convex surface portion or area enclosing the projections of the plurality of evaporation channels on the substantially planar thermo-conducting wall. Such a minimum convex surface is uniquely defined.

The inlet channel—more precisely its projection onto the thermo-conducting wall—can be situated outside of this cooling surface portion. Hence, the projection of the inlet channel should have no substantial overlap with the cooling surface portion, e.g., less than 20% overlap (e.g., less than 20% or the surface area of the inlet channel's projection overlaps with the cooling area), in another exemplary embodiment preferably less than 10% overlap, and in another exemplary embodiment more preferably less than 1% overlap.

During operation of an exemplary cooling circuit according to the present disclosure, a cooling fluid is moved therein by a convective force. This movement can begin when a heat emitting device provides thermal energy to the cooling fluid via an evaporating unit, causing the cooling fluid to expand or boil and become less dense, and thus more buoyant with respect to the cooler fluid, which is not yet provided with the thermal energy of the heat emitting device. Convection moves the heated or evaporated cooling fluid away from the evaporating unit to a condenser as it is simultaneously replaced by cooler fluid returning from the condenser that can be under the influence of gravity.

The cooling fluid, which can be delivered to the evaporating unit in liquid form or with low vapour qualities (e.g., with a low content of vapour), takes up the greatest amount of thermal energy from the heat emitting device when getting into contact with the surface of the core (e.g. evaporation channels) of the evaporating unit. Thereby, the liquid undergoes a phase change and becomes vapour. As is well known, the amount of energy absorbed during this process, the enthalpy of vaporization, is high. As an example, the energy which is necessary to vaporize 1 kg of water (at ambient pressure) having a temperature of little less than 100° C. is approximately the same energy which is specified to heat up the same amount of water from the freezing point to liquid water of slightly below 100° C.

Hence, when the characteristics of the coolant and the operating pressures in the cooling system can suitably chosen by design, which is a standard task for a skilled person, the evaporating unit can dissipate significant amounts of thermal energy from heat emitting devices such as electronic components by promoting the vaporization of the coolant, e.g., a phase change. Thereby, the temperature change between the liquid coolant before entering the evaporating unit and the vapour leaving the evaporating unit cannot be significant, as the dissipated energy is mainly transferred in the vaporization or phase change process. It should be understood that the vaporized coolant can freely stream out of the evaporating unit in order to minimize a build-up of pressure of already gaseous coolant in the core, which can reduce the effectiveness of the further vaporization process and thus reduce the cooling efficiency.

According to exemplary embodiments described herein, the evaporating unit includes an evaporating body including at least one core with a volume for accommodating a cooling fluid therein. The evaporating body can further include thermo-conducting walls that are in good thermal contact with the cooling fluid in the inner volume of the evaporating body, such that heat produced by an electronic component abutting the thermo-conducting wall(s) is transferred to the cooling fluid. The thermo-conducting walls (e.g., made of a metal such as aluminium) can be substantially planar and an integral part of the evaporating body, or can be mounted to it during manufacturing, such as by brazing.

According to an exemplary embodiment of the present disclosure, the evaporating unit can be designed to be made of a metal such as aluminium or copper but it can also be made of other metals or alloys. According to another exemplary embodiment of the present disclosure, it can be fabricated as a single rigid body.

The outer dimensions of the body of the evaporating unit, such as its diameter or length and width, are similar to the ones of the electronic component to be cooled, for example a power semiconductor such as an IGTB. The inside or core of the evaporating body can be designed to have a considerable surface for exchanging heat from the thermo-conducting walls and the cooling fluid in order to increase the area for heat exchange and to locally decrease the heat flux. Hence, in order to increase the aforesaid effective area of energy exchange between the core and the liquid coolant, the effective area can be enhanced by various measures. The core can, e.g., include any type of fins, such as corrugated fins, louvered fins, wavy fins, staggered fins, offset fins, or straight fins. Further, the core can alternatively or additionally include one of a multiport or multi channel profile, a metal sheet, a tube, at least two connected tube sections, a honeycomb structure, or an open cell foam.

The evaporating unit can include a cooling fluid distribution and collection chamber. The distribution chamber—fluid distributor or manifold—can distribute the liquid cooling fluid received from a condenser to a first end of a plurality of evaporation channels within the core of the evaporating unit whereas the collection chamber—fluid collector or manifold—can collect evaporated cooling fluid from the second ends of the plurality of evaporation channels and subsequently let out the evaporated cooling fluid to the condenser. Further, the longitudinal axes of the fluid distributor and collector can be arranged perpendicular to the longitudinal axes of the plurality of evaporation channels. In other words, if the evaporating channels are arranged vertically with respect to the earth's surface, the fluid distributor and collector can be arranged horizontally with respect to the earth's surface. According to exemplary embodiments described herein, the cooling fluid distributor/collector can either be separate parts or integral parts of the evaporator body.

The exemplary cooling fluid collector of the present disclosure can have a separator volume that enables a separation of the liquid and gas phases of the cooling fluid (e.g., at least a partial separation of a predominantly liquid portion from a predominantly vaporous or gaseous portion). The predominantly gaseous phase can be let out via a vapour riser pipe system to a condenser. Similarly, the cooling fluid distributor can also have an inner volume, which during operation contains a pool of liquid cooling fluid that is continuously fed to the core of the evaporating unit. Further, a liquid downcomer pipe system can provide the cooling fluid distributor continuously with condensed cooling fluid from the condenser.

Furthermore, insulating sections, for instance dielectric unions can be provided anywhere along the vapour riser or liquid downcomer pipe systems to electrically insulate the evaporating unit from the condenser. Moreover, the electrical separation between the evaporating unit and the condenser can further be supported by the use of a dielectric cooling fluid. The cooling fluid used can, as non-limiting examples, be chosen from refrigerants R134a, R1234yf, R1234ze, R245fa, ammonia or any suitable fluids having thermo-physical properties matching the operating conditions of the individual system. Choosing an appropriate cooling fluid depending on the individual setup and characteristics is a task well within the standard knowledge of the skilled person.

Exemplary embodiments of the present disclosure can include at least one inlet channel and at least one outlet channel to feed and remove the liquid/vaporous cooling fluid to and from the evaporating unit. The shape and size of the inlet and outlet channels can vary depending on the electrical and mechanical specifications of the installation, however the diameter of the in- and/or outlet channels can be greater than the diameter of an evaporation channel. Further, the in- and/or outlet channels can be disposed parallel to or at an angle with respect to the plurality of evaporation channels.

According to exemplary embodiments described herein, the at least one inlet and at least one outlet channel are positioned, within the evaporation unit, in a common plane with the evaporation channels but within this plane on different sides of the evaporation channels.

Still according to exemplary embodiments of the present disclosure, the at least one inlet and at least one outlet channel are positioned in different halves of the evaporating unit. The halves are defined with respect to a central plane of the evaporating unit, such as to lie on different sides of a central plane. The central plane can be defined to extend parallel to the longitudinal axes of the plurality of evaporation channels and perpendicular to the plane defined by the thermo-conducting wall (and/or to a plane in which the evaporation channels are aligned).

For example, the at least one inlet channel is positioned in one half of the evaporating unit and is connected to the fluid distributor at a first position and the at least one outlet channel is positioned in the other half of the evaporating unit and is connected to the fluid collector at a second position which is diagonally located from the first position. In other words, the end of the inlet channel connected to the fluid distributor and the beginning of the outlet channel connected to the fluid collector can be arranged diagonally across from each other on opposing sides of a central plane of the evaporating unit. Such an arrangement of the inlet and outlet channel ensures the homogenous distribution of the cooling fluid inside the body of the evaporating unit, e.g., inside of the plurality of evaporation channels of the evaporating unit. A homogenous distribution of the cooling fluid within the plurality of evaporation channels further reduces local temperature non-uniformities, e.g., it reduces undesirable hot spots in the core of the evaporating unit and thus provides a more efficient cooling effect.

Further, in order to avoid temperature non-uniformities and in order to increase cooling efficiency, the evaporating unit can be designed to pre-heat the cooling fluid therein as follows. The evaporating unit can include an inlet channel for receiving cooling fluid from a condenser. According to exemplary embodiments disclosed herein, the inlet channel can guide the cooling fluid in the evaporating body to a plurality of evaporation channels in the core of the evaporating unit via a fluid distributor. The thermal energy from at least one heat emitting device can be transferred to the cooling fluid inside of the plurality of evaporation channels via at least one thermo-conducting wall of the evaporating unit. In other words, the thermo-conducting wall includes a cooling surface portion that can be defined as being the minimum convex surface portion enclosing the projections of the plurality of evaporation channels onto the aforesaid thermo-conducting wall. The cooling surface portion can experience a large transfer of thermal energy between the heat emitting device and the cooling fluid.

In order to effectively pre-heat the cooling fluid before it enters the evaporation channels via the fluid distributor the inlet channel can be disposed in the evaporating unit such that its projection on the thermo-conducting wall is situated outside the aforementioned cooling surface portion. The inlet channel can be positioned at certain distances from the plurality of evaporation channels in order to set the degree of pre-heating. Thereby, in the operating state, the cooling fluid inside of the inlet channel can receive thermal energy from the heat emitting device before entering the plurality of evaporation channels via the fluid distributor.

Further, by arranging the inlet channel such that its projection on the thermo-conducting wall is situated outside of the cooling surface portion allows thermal energy from the heat emitting device to be transferred directly to the cooling fluid inside of the inlet channel without interference by the plurality of evaporation channels. For example, in a comparative example in which the evaporation channels are arranged between the inlet channel and the cooling surface portion (such that the inlet channel's projection could not be arranged outside of the cooling surface portion), the evaporation channels could absorb a large fraction of the thermal energy, and no effective pre-heating could take place. Moreover, by positioning the inlet channel outside of the cooling surface portion, the amount of thermal energy transferred from the heat emitting device to the inlet channel can be adjusted by changing the position of the heat emitting device. For example, repositioning the heat emitting device, with respect to the cooling surface portion, further away from the projection of the inlet channel on the thermo-conducting wall, could, for instance, provide less thermal-energy to the cooling fluid inside of the inlet channel (e.g., less pre-heating of the cooling fluid inside of the inlet channel). Repositioning the heat emitting device, with respect to the cooling surface portion, closer to the projection of the inlet channel on the thermo-conducting wall, could, for example, provide more thermal energy to the cooling fluid inside of the inlet channel (e.g., more pre-heating of the cooling fluid inside of the inlet channel). Hence, the level of pre-heating of the cooling fluid inside of the inlet channel can be adjusted conveniently.

According to exemplary embodiments of the present disclosure, the aforesaid distance can be measured as the distance between the projections on the thermo-conducting wall of the minimum surface portion enclosing the projections of the plurality of evaporation channels and the projection of the inlet channel respectively. For a given pre-heating, the aforesaid distance can be roughly proportional to the temperature difference, which can be defined as the difference in temperature between the cooling fluid on entry into the evaporating unit and on entry into the fluid distributor of the evaporating unit.

According to yet another exemplary embodiment of the present disclosure, the amount of pre-heating can be set by changing the distance between the inlet channel and the thermo-conducting wall. In other words, the inlet channel can be positioned either closer to the thermo-conducting wall for more pre-heating or further away from the thermo-conducting wall, towards the inside of the evaporating unit for less pre-heating. Hence, the inlet channel can be positioned at a lateral distance from the plurality of evaporation channels, e.g., from 1 mm to 30 mm, or according to another exemplary embodiment from 6 mm to 18 mm. The lateral distance can be parallel to the plane of the thermo-conducting wall and/or perpendicular to the axis of the plurality of evaporation channels.

According to exemplary embodiments described herein, the inlet channel can be arranged such that its longitudinal axis is parallel to the longitudinal axis of the plurality of evaporation channels. In further embodiments, the inlet channel and the plurality of evaporation channels can be positioned in the same plane.

In yet another exemplary embodiment, the inlet channel can be arranged at an angle with respect to longitudinal axis of the plurality of evaporation channels. This angle can be defined as the angle between the projections on the thermo-conducting wall of the minimum surface portion enclosing the projections of the plurality of evaporation channels and the projection of the inlet channel respectively. For example, the angle can be from 10° to 85°, and according to another exemplary embodiment preferably from 30° to 65°. Thereby, as the cooling fluid flows towards the fluid distributor during operation, the thermal energy transferred from the heat emitting device to the cooling fluid is gradually increased. Hence, a more homogenous pre-heating of the cooling fluid can be achieved. In another exemplary embodiment described herein, the distance between the inlet channel and the plurality of evaporation channels can be continuously decreasing along the entire length of the inlet channel and/or can be continuously decreasing along a portion of the inlet channel only.

The inlet channel, according to exemplary embodiments described herein, can further be inclined towards the inside or towards the frontal plane of the evaporating body, e.g., at an angle with respect to the thermo-conducting wall, for instance, at an angle from 0° to 45°, according to another exemplary embodiment preferably from 10° to 35°. Thereby, in a similar manner as described above, a more homogenous pre-heating of the cooling fluid can be achieved.

According to an exemplary embodiment of the present disclosure, two sets of evaporation channels can be provided, each set having a plurality of evaporation channels. Each set of evaporation channels can define a respective plane such that the axes of all the evaporation channels of the set are arranged in the plane. In an exemplary embodiment disclosed herein, the planes of all sets of evaporation channels are parallel to each other.

According to another exemplary embodiment, the evaporating unit with at least two thermo-conducting walls can include two inlet channels (the first inlet channel and a second inlet channel). If there are two sets of evaporation channels, the two inlet channels can be arranged to feed condensed cooling fluid from a condenser to the two sets of evaporation channels via a common fluid distributor or via two fluid distributors. Moreover, the evaporating unit can include two outlet channels (the first outlet channel and a second outlet channel) for letting out the evaporated cooling fluid from two fluid collectors to the condenser. Each of the inlet channels and/or the outlet channels can be arranged with its axis in the plane defined by the respective set of evaporation channels.

Thus, then exemplary evaporating unit can include a dual-sided arrangement in which, respectively, an inlet channel, a fluid distributor, set of (a plurality of) evaporation channels, a fluid collector and an outlet channel are disposed on opposing sides of the evaporating unit, each for instance being a mirror image of the other and facing a respective thermo-conducting wall. All these elements can be provided in a single rigid evaporating unit. The above described arrangement can, in the case of two individual fluid distributors and two individual fluid collectors, provide two separate cooling circuits inside of a single evaporating unit. This can, for instance, enable pre-heating of the cooling fluid to be greater on one side of the evaporating unit than on the other.

The two sets of the plurality of evaporation channels, one on either side of the evaporating unit, for example, can vary in the number of evaporation channel and/or with respect to the dimension of their cooling surface portion that is defined as being the minimum surface portion enclosing the projections of a set of the plurality of evaporation channels onto respective thermo-conducting walls. Thereby, the cooling surface portion on one side of the evaporating unit can be smaller than on the other, opposing side. Furthermore, each of the inlet and/or outlet channels can either be at the same or at a different angle with respect to the plurality of evaporation channels and/or the frontal plane of the evaporating unit correspondingly (see description above).

The frontal plane of the evaporating unit can be arranged to divide the evaporating unit into a front side and back side, hence, the aforesaid dual sided-arrangement that each includes a thermo-conducting wall for cooling a heat emitting device respectively. According to exemplary embodiments herein, the front side and back side can be separated from each other such that during operation, the cooling fluid remains on each side of the evaporating unit respectively. In further exemplary embodiments of the present disclosure, the fluid collectors and outlet channels of the front and back side of the evaporating unit can be connected to each other. In other words, the front and back side of the evaporating unit can share the same fluid collector and/or outlet channel.

As far as manufacturing is concerned, in cases in which the evaporating unit includes multiple parts, brazing or soldering can ensure a good mechanical, thermal, and electrical joint amongst the parts. If the core includes fins, the core can also be assembled by adding multiple fin layers on top of each other to increase the core height and the heat exchange area. In between, layers of brazing foil can be inserted to provide a better joint between two consecutive layers. If the fin sheets are cladded with brazing material, the interposing foil can optionally be omitted. The evaporating unit can also be manufactured by an extrusion process, which ensures an exact and smooth surface finish.

The evaporated cooling fluid transfers its thermal energy to an external coolant in a condenser, whereby the density of the cooling fluid significantly increases during the accompanying condensation. This increase in density provides for the low pressure specified on the outlet side of the evaporating unit, promoting the exit of the vaporized cooling fluid from the evaporating unit to the condenser.

According to exemplary embodiments of the present disclosure, the condenser can be designed, e.g. as any known air heat exchanger with an internal volume for accommodating a cooling fluid therein, and at least one inlet and outlet for circulating a cooling fluid there through. Further, to have a large heat transfer area, a plate fin-type heat exchanger can be employed in the modular cooling system described herein. This type of heat exchanger can use at least one passageway with fins to increase the cooling efficiency of the unit to guide an external coolant medium there through. There are various design options for the at least one passageway including straight fins, offset fins and wavy fins (e.g. louvered fins). Such fin-type heat exchangers can be made of an aluminium alloy that provides high heat transfer efficiency. These types of materials and alloys reduce the overall weight of the modular cooling system and enable the condenser to withstand high working pressures.

The condenser can include an inlet for receiving an evaporated cooling fluid, a condenser body for condensing the cooling fluid, and an outlet for outputting the condensed liquid cooling fluid. The condenser, according to exemplary embodiments described herein, can be in fluid communication with at least one evaporating unit. Similarly to the evaporating unit, the condenser can further include a cooling fluid collector/distributor, each of which can include an inner volume to accommodate the cooling fluid in both phases respectively. With regard to the condenser, the cooling fluid distributor can distribute the evaporated cooling fluid received from the evaporating unit to the condenser body, whereas the cooling fluid collector can collect the condensed liquid cooling fluid within the condenser body to eventually transfer it back to the evaporator body. The aforesaid cooling fluid distributor/collector can be separate or integral parts of the condenser.

According to exemplary embodiments of the present disclosure, a plurality of evaporating units can be alternately stacked with one or a plurality of heat emitting devices and pressed together by a compressive force to form a stack or press-pack for use in a cooling circuit. In order to utilize the full cooling potential of the evaporating units, the stack including the heat emitting devices, evaporating units, support rods and other components should be properly aligned, for example, such that the heat emitting device(s) are in good contact with the thermo-conducting wall(s) of the evaporating units. In other words, the mechanical design and assembly of the stack is important for the cooling performance of the evaporating units and for the reliability of the heat emitting devices because, for instance, inhomogeneous pressure distribution in the stack can lead to premature failure of the heat emitting devices. Hence, in order to ensure proper alignment of the plurality of evaporating units, each unit can include an alignment opening or hole where, for instance, support rods of a clamping arrangement are inserted in order to ensure a good positioning of each evaporating unit and heat emitting device because current is flowing into the whole stack.

A clamping arrangement or fixture can be employed that is capable to withstand without damage temperature levels and forces caused by the mechanical expansion and contraction of the press-pack due to temperature changes that appear at working conditions. The clamping arrangement can, for instance, include force indicators, which ensure that the stack of alternating evaporating units and electronic components are clamped with the right force to ensure optimal performance and homogenous pressure distribution (optionally, for instance via a load spreader that can be a stainless steel plate) over the whole contact surface of the electrical component(s). A too low clamping force can result in increased impedance and a decrease in the surge current rating, and a too high clamping force can damage the electronic component(s) causing them to fail prematurely.

In the exemplary embodiments of the present disclosure, the pipe systems used in order to fluidly connect the evaporating units and condenser can be flexible to facilitate assembly and allow thermal expansion of components made of different materials. For example, flexible pipes can provide a freedom of movement in the case that the stack length decreases during compression by the clamping arrangement. The flexibility of the pipe system can be achieved by providing the pipe system with at least one flexible portion per pipe. This flexible portion can be interposed anywhere along the length of the pipe or can be positioned at either or both end(s) of the pipe.

The exemplary cooling circuit described herein can be considered as a gravitational cooling circuit, e.g., a cooling circuit in which the evaporating unit can be in a vertical bottom position and the condenser can be in a vertical top position above the evaporating unit. In this manner, gravity can help to maintain the cooling fluid circulation, because the vaporous cooling fluid is moved vertically upwardly due to its buoyancy, and the liquid cooling fluid returning from the condenser to the evaporating unit is moved vertically downwardly due to its higher mass density.

The evaporating unit could also be mounted in an inclined or even in a horizontal orientation (relative to the earth's surface or such that the direction of action of the evaporating unit is perpendicular to the gravitational force of the earth as shown in FIG. 1). Still, in this case at least the top, bottom, and any other suitable part as desired, can be defined herein by the direction of flow of the evaporated cooling fluid in the evaporating body or cooling circuit. For example, when the evaporating unit is mounted in a horizontal orientation relative to the earth's surface, the evaporated cooling liquid in the evaporating unit still moves toward the condenser, e.g., the top of the liquid column provides sufficient pressure. According to another exemplary embodiment, a motor driven pump can facilitate and support the circulation of the cooling fluid.

FIG. 1 and FIG. 2 schematically show perspective views of cooling circuits according to exemplary embodiments of the present disclosure. As shown in FIG. 1, cooling circuit 20a includes a condenser 80 and a stack 22 that includes a plurality of evaporating units 40, each evaporating unit 40 having a cooling fluid inlet channel 43a and outlet channel 50a, arranged in alternately with a plurality of heat emitting devices 10. As shown in FIG. 1, the longitudinal direction of stack 22 is perpendicular to the earth's surface. However, in another exemplary embodiment of the present disclosure as shown in FIG. 2, a cooling circuit can include a stack of alternating evaporating units and heat emitting devices that has a longitudinal direction, which is parallel to the earth's surface or perpendicular to the gravitational force of the earth. In the latter arrangement the cooling fluid inlet and outlet channels of the respective evaporating units could be perpendicular to the earth's surface or parallel to the gravitational force of the earth in order to ease the fluid flow in both directions, in and out.

A clamping arrangement 25 exerts a compressive force on stack 22 such that the plurality of evaporating units 40 and heat emitting devices 10 are pressed together. Normally, the clamping arrangement 25 includes two or more parallel support rods 26. However, longer stacks can employ more than two support rods, such as for instance three, four, five or six support rods, in order to ensure an optimum rod mechanical stability that provides a homogenous clamping force distribution (e.g., pressure force distribution) on the electronic components.

According to an exemplary embodiment described herein, the clamping arrangement 25 can exert a compressive force in a longitudinal direction of stack 22. This serves both for mechanically fixing the stack together, as well as to improve the contact for conductive heat flow between the heat emitting devices 10 and the plurality of evaporating units 40 and to establish a good electrical contact. The force exerted by the clamping arrangement can be up to 200 kN, e.g. 50, 100 or 150 kN. In the displayed example, the number of evaporating units is five, whereby the number of evaporating units can vary from one to an arbitrary number that can be determined by the number of stacked heat emitting devices to be cooled, e.g., examples for numbers of evaporating units are 5, 7, 9, 13, 17, or 21. The heat emitting devices 10 can be any type of electronic component, e.g. (non-limiting) semiconductor switches such as thyristors, inductors, resistors, diodes, or capacitors, or combinations thereof. Clamping arrangement 25 can include at least one load spreader for homogenous pressure transfer to the evaporator units 40 of stack 22. The clamping arrangement can ensure efficient cooling of evaporating units, thus providing a more reliable and longer lifespan of the heat emitting devices.

Furthermore, clamping arrangement 25 can include insulating materials such as glass-fibre epoxy, which enables a simplified and more compact design of stack 22 compared to cases where traditional materials such as steel are used that can specify additional insulation of the aforementioned parts and/or enough air strike distance from live parts.

According to the exemplary embodiment shown in FIG. 1, the cooling circuit 20a includes a vapour riser pipe system 60 for fluidly connecting an evaporating unit 40 to a condenser 80, and a liquid downcomer pipe system 70 for fluidly connecting the condenser 80 to evaporating unit 40. More precisely, the vapour riser pipe system 60 connects an outlet channel 50a of the evaporating unit 40 with an inlet channel 81 of the condenser 80, and the liquid downcomer pipe system 70 connects an outlet channel 83 of the condenser 80 with an inlet channel 43a of the evaporating unit 40. This arrangement of cooling circuit 20a creates a hermetically closed fluid circuit wherein a cooling fluid can circulate without being directly exposed to the external environment.

The vapour riser 60 and liquid downcomer 70 pipe systems can be manufactured of either an electrically conductive material, or of an insulating material. In some embodiments, a part of each pipe system can be made from insulating material, and a further part of a conductive material, e.g., metal. If the pipe systems do not include at least an insulating part, electrically insulating portions 100 should be used in the vapour riser 60 and liquid downcomer 70 pipe systems, respectively. The insulating portions 100 are connected to the rest of the system, through the use of a connector (not shown in the Figs.). A known problem is presented by the different thermal expansion of components made of different materials. To overcome this issue, a piece of metallic tubing of the same material as that of evaporating unit 40 and vapour riser 60 and liquid downcomer 70 pipe systems can be attached to both ends of the insulating sections 100. This link, which could absorb the stresses generated by different thermal expansions of the parts, can be realized by gluing, brazing, or soldering the pipes to the insulating section 100.

According to an exemplary embodiment described herein, the vapour riser 60 and liquid downcomer 70 pipe systems of cooling circuit 20 can include at least one flexible portion 150 each, which gives the system the freedom to allow clamping of the stack 22 of evaporating units 40 and heat emitting devices 10. For example, the aforesaid flexible portions 150 can allow a relative movement between the plurality of evaporating units 40 and the condenser 80, respectively a movement of the plurality of evaporating units 40 relative to each other, for example by 10 mm in both directions in a longitudinal direction of stack 22. Hence, for example in case of one or more of the plurality of heat emitting devices 10, power semiconductors, being replaced by devices having different dimensions, the difference can be equalized by the flexible pipe portions 150. The flexible portions 150 can include tube bellows, corrugated tubes, and/or can include an electrically insulating elastic non-metallic material such as an elastomer. In exemplary embodiments herein, the vapour riser 60 and liquid downcomer 70 pipe systems can include further flexible portions 150 disposed anywhere between the plurality of evaporating units 40 and condenser 80.

FIG. 2 shows a perspective view of a cooling circuit 20b according to exemplary embodiments of the present disclosure. Cooling circuit 20b includes most of the components described with respect to cooling circuit 20a above (see FIG. 1). However, cooling circuit 20b is arranged such that the longitudinal direction of stack 22 is parallel to the earth's surface. In other words, the evaporating units 40 are arranged in an upright position with respect to the earth's surface. In exemplary embodiments described herein, the evaporating units 40 can be arranged 'vertically' such that their direction of action is parallel to the gravitational force of the earth. This type of arrangement can facilitate the movement of the cooling fluid inside of the cooling circuit. Furthermore, in the embodiment shown in FIG. 2, the evaporating units 40 alternately stacked with the heat emitting devices 10 each include at least two inlet channels, a first 43a and second 43b inlet channel, and at least two outlet channels, a first 50a and a second 50b inlet channel (a more detailed description with respect to dual-sided evaporating units can be found below with respect to FIG. 5 and FIG. 6). The evaporating units shown in FIG. 1 can also be arranged in an upright fashion, and substantially in the same manner as shown the cooling circuit 20b of FIG. 2.

Each of the inlet 43a, 43b and outlet 50a, 50b channels of the evaporating units 40 shown in FIG. 2 can be fluidly connected to the vapour riser 60 and liquid downcomer 70 pipe systems respectively via separate shorter pipes 61, 71. These shorter connecting pipes 61, 71 can be included in the vapour riser 60 or liquid downcomer 70 pipe systems when describing exemplary embodiments herein.

In more detail, each cooling unit 40 of cooling circuit 20b can include a pair of inlet channels 43a, 43b and a pair of outlet channels 50a, 50b that are connected to a pair of connecting liquid downcomer pipes 71 and a pair of connecting vapour riser pipes 61 respectively. Each of these connecting pipes can include at least one flexible portion 150 that similarly to the flexible portions 150 described with respect to FIG. 1 above, allows for a relative movement between the plurality of evaporating units 40 and the condenser 80, respectively a movement of the plurality of evaporating units 40 relative to each other, for example by 10 mm in both directions in a longitudinal direction of stack 22. Moreover, each of the connecting pipes 61, 71 can include an electrically insulating section 100 or can equally include a single electrically insulating portion (not shown in the Figs.) per pair of connecting pipes 61, 71 for each evaporating unit 40. Such a single electrically insulating portion can provide additional stability to the cooling circuit.

Similarly, in exemplary embodiments of the present disclosure, a single connecting vapour riser pipe and liquid downcomer pipe can be fluidly connected to the pair of outlet channels and pair of inlet channels respectively (not shown in the Figs.). Such an arrangement can provide a more cost efficient and simplified cooling circuit with fewer separate parts.

FIG. 3 schematically shows a top view of an evaporating unit according to an exemplary embodiment of the present disclosure. As shown in FIG. 3, the evaporating unit 40a includes two thermo-conducting walls 42a, 42b that are arranged on opposite sides of evaporating unit 40a. The thermo-conducting walls can cover the entire surface of the respective sides of the evaporating unit 40a. According to another exemplary embodiment of the present disclosure, the thermo-conducting walls can only cover a portion, for instance, from 70% to 95%, preferably from 80% to 90% of the available surface area on each side of the evaporating unit.

Further, FIG. 3 shows a top view of a cooling surface portion 51 of thermo-conducting walls 42a, 42b. Cooling surface portion 51 can, be defined as being the minimum convex surface portion enclosing the projections of the plurality of evaporation channels 43a onto either one of the thermo-conducting walls 42a, 42b of evaporating unit 40a. A heat emitting device (not shown in this Fig.) can be connected to thermo-conducting wall 42a, 42b of evaporating unit 40a such that it abuts thermo-conducting wall 42a, 42b within cooling surface portion 51.

The evaporating unit 40a also includes an inlet channel 43a for receiving a liquid cooling fluid from a condenser and an outlet channel 50a for letting out the evaporated cooling fluid to the condenser. The evaporating unit core 44 includes a plurality of evaporation channels 45a arranged side by side in a longitudinal direction (aligned within a plane) to fluidly connect the inlet channel 43a to the outlet channel 50a. Furthermore, a fluid distributor 48a and a fluid collector 49a can be disposed on either ends of the plurality of evaporation channels 45a (see FIG. 4 and the corresponding description below).

In the exemplary embodiment of FIG. 3, inlet channel 43a can be arranged next to an outermost of the plurality of evaporation channels 45a. The outlet channel 50a can be arranged on top of the other outermost of the plurality of evaporation channels 45a. Further, an imaginary plane A-A is shown in the embodiment of FIG. 3, which separates evaporating unit 40a down its centre into two symmetrical halves. For this purpose, imaginary plane A-A can be defined as the plane of symmetry such that the aforesaid two halves are each other's mirror image. Furthermore, a central plane of the evaporating unit 40a (not shown in this Fig.) can be defined as a plane that is perpendicular to imaginary plane A-A at the centre of the evaporating unit 40a. This central plane, similarly to imaginary plane A-A, can separate evaporating unit 40a into two halves such that inlet channel 43a and outlet channel 50a are arranged on opposing sides or halves of evaporating unit 40a.

FIG. 4 schematically shows a cross-section along plane A-A of the evaporating unit shown in FIG. 3 according to an exemplary embodiment of the present disclosure. As shown in FIG. 4, the cross-section of evaporating unit 40a shows the plurality of evaporation channels 45a disposed with their longitudinal axes parallel to the longitudinal axes of both the inlet channel 43a and the outlet channel 50a. Further, the longitudinal axes or direction of longest extension of fluid distributor 48a and fluid collector 49a can be arranged perpendicular with respect to the longitudinal axes of the plurality of evaporation channels 45a.

According to the embodiment shown in FIG. 4, the fluid distributor 48a provides liquid cooling fluid to the first ends 46a of the plurality of evaporation channels 45a. During operation, the liquid cooling fluid evaporates inside of the plurality of evaporation channels 45a due to the thermal energy provided by a heat emitting device (not shown in FIG. 4). The fluid collector 49a receives the evaporated cooling fluid from the second ends 47a of the plurality of evaporation channels 45a. Finally, the evaporated cooling fluid is let out from evaporating unit 40a via outlet channel 50a.

According to exemplary embodiments of the present disclosure and with respect to plane A-A, the end portion of the inlet channel 43a that connects to the fluid distributor 48a can be arranged diagonally opposite of the end portion of the outlet channel 50a that connects to the fluid collector 49a (e.g., the edges of the evaporator body closest to the respective end portions are located diagonally with respect to each other). In other words, the inlet channel 43a and the outlet channel 50a can be arranged on opposing sides of a central plane D-D (see FIG. 8, the central plane D-D is also denoted with reference number 33) of the evaporating unit 40a that extends parallel to the longitudinal axes of the plurality of evaporation channels 45a and perpendicular to the thermo-conducting walls 42a, 42b (and/or perpendicular to the longitudinal direction 170 of the plurality of evaporation channels 45a). Central plane D-D can also be described herein as being perpendicular to plane A-A. Arranging the end portions of the inlet and outlet channels in the manner mentioned above ensures a homogenous distribution of the cooling fluid within the core of the evaporating unit 40a, e.g., within the plurality of evaporation channels 45*a*. Thereby, undesirable hot spots can be avoided and a more reliable and better cooling efficiency of the evaporating unit 40*a* can be achieved.

Fluid distributor 48*a* can be a tube-like structure with a plurality of openings in a direction parallel to its longitudinal axis. The openings are fluidly connected to respective first ends 46*a* of the plurality of evaporation channels 45*a*. Similarly, fluid collector 49*a* can also be a tube-like structure with a plurality of openings in a direction parallel to its longitudinal axis and wherein the openings are fluidly connected to respective second ends 47*a* of the plurality of evaporation channels 45*a*.

Further, FIG. 4 shows a figurative representation (see dashed line in FIG. 4) of a cooling surface portion 51 of the thermo-conducting walls 42*a*, 42*b*. Cooling surface portion 51 can be defined as being the minimum convex surface portion enclosing the projections of the plurality of evaporation channels 43*a* onto either one of the thermo-conducting walls 42*a*, 42*b* of evaporating unit 40*a*. The inlet channel 43*a* can be arranged such that its projection on either one of the thermo-conducting walls 42*a*, 42*b* is located outside of the cooling surface portion 51. The inlet channel 43*a* can be positioned at a certain pre-heating distance 52 from the plurality of evaporation channels 45*a* in order to set the degree of pre-heating. Thereby, in the operating state, the cooling fluid inside of the inlet channel 43*a* can receive thermal energy from the heat emitting device before entering the plurality of evaporation channels 45*a* via fluid distributor 48*a*.

The aforementioned pre-heating distance 52 can further be defined as the distance measured on a thermo-conducting wall between the cooling surface portion 51 and the projection of the inlet channel 43*a* on the corresponding thermo-conducting wall 42*a*, 42*b*. For a given amount of pre-heating, pre-heating distance 52 can be roughly proportional to the temperature difference of the cooling fluid, which is defined as being the difference in temperature of the cooling fluid on entry into the evaporating unit 40*a* compared to the temperature of the cooling fluid on entry into the fluid distributor 48*a*.

According to another exemplary embodiment of the present disclosure, a pre-heating distance can be described as the shortest distance between the longitudinal axis of inlet channel 43*a* and the cooling surface portion 51 of either one of the thermo-conducting walls 42*a* and 42*b*. Such a pre-heating distance can be from 0.5 mm to 30 mm, preferably from 4 mm to 16 mm.

The evaporating unit can be manufactured from several parts which are subsequently assembled. For example, the upper and lower part shown in FIG. 3, divided by the line A-A, can be fabricated separately and then assembled by any assembling technique known in the art. Alternatively, with reference to FIG. 4, a top part (above the evaporation channels 45*a*), a bottom part (below the evaporation channels 45*a*) and the middle part in-between and including the evaporation channels 45*a* can be fabricated separately and then assembled. The fluid collector 49*a* and the fluid distributor 48*a* are then formed by a space between the middle part and the top part/bottom part, respectively.

FIG. 5 schematically shows a top view of an evaporating unit according to an exemplary embodiment of the present disclosure. As shown in FIG. 5, an evaporating unit 40*b* includes two sets of evaporation channels 45*a*, 45*b*. In other words, evaporating unit 40*b* can include two cores 44*a*, 44*b* in a multi-core configuration. According to exemplary embodiments of the present disclosure, the evaporating unit can include more than two cores such as, for instance, from three to eight cores and more. Further, FIG. 5 shows a top view of a cooling surface portion 51 of thermo-conducting walls 42*a*, 42*b*.

In the exemplary embodiment shown in FIG. 5, an imaginary plane B-B (also denoted with reference number 31) can divide evaporating unit 40*b* into a front and back half each including a set of evaporation channels 45*a* and 45*b* facing the thermo-conducting walls 42*a* and 42*b* respectively. The back and front halves of evaporating unit 40*b* can be configured to be mirror images of each other. In other words, each half includes an inlet channel 43*a* and 43*b*, a fluid distributor 48*a* and 48*b* (see FIG. 4 and FIG. 7), a plurality of evaporation channels 45*a* and 45*b*, a fluid collector 49*a* and 49*b*, and an outlet channel 50*a* and 50*b* respectively.

The advantage of such multi-core configurations is that different degrees of pre-heating can be provided to the cooling fluid in each inlet channel. In other words, the inlet channels can be disposed at different pre-heating distances.

In yet another exemplary embodiment of the present disclosure, the back and front halves of evaporating unit 40*c* can be configured to differ from each other, for example, with respect to the orientation of their respective in- and outlet channels. FIG. 6 schematically shows a top view of an evaporating unit according to an exemplary embodiment of the present disclosure. As shown in FIG. 6, an imaginary plane C-C (also denoted with reference number 32) divides evaporating unit 40*c* into a front and back half. Therein, the positions of inlet channel 43*a* and outlet channel 50*a* can be considered as reversed when compared to the positions of inlet channel 43*b* and outlet channel 50*b*. In other words, assuming that the plurality of evaporation channels 45*a* and 45*b* are arranged to be mirror images of each other, inlet channel 43*a* can be arranged at a certain pre-heating distance from an outermost evaporation channel 45*a*, which is diagonally across from an outermost evaporation channel 45*b*. Inlet channel 43*b* and outlet channels 50*a* and 50*b* can be arranged in a similar manner as described above. Further, FIG. 6 shows a top view of a cooling surface portion 51 of thermo-conducting walls 42*a*, 42*b*.

FIG. 7 schematically shows a cross-section of an evaporating unit according to an exemplary embodiment of the present disclosure. As shown in FIG. 7, an evaporating unit 40*d* according to a further embodiment herein. Evaporating unit 40*d* includes two alignment portions 120 disposed on opposite sides thereof. Alignment portions 120 can be breakthroughs or holes that enable support rods 26 to pass there through and align a stack 22 of evaporating units 40*d* arranged alternately with a plurality of heat emitting devices 10 (see FIG. 1 and FIG. 2). The alignment portions 120 can be disposed on any sides of the evaporating unit 40*d* and/or can be arranged anywhere in the evaporating unit 40*d* provided that none of the functional features (inlet channel, fluid distributor, plurality of evaporation channels, fluid collector and outlet channel) are disturbed.

Further, the exemplary embodiment shown in FIG. 7 shows an electrical connection lip 160 of the evaporating unit 40*d*. The electrical connection lip 160 can also be arranged along other sides of the evaporating unit depending on the layout of the respective unit.

The evaporating unit 40*d*, shown in FIG. 7, includes inlet channel 43*c* that can be arranged at an angle 110 with respect to the plurality of evaporation channels 45*b*. For instance, this angle can be from 20° to 80°, preferably from 25° to 55° with respect to the plurality of evaporation channels 45*b*. In other words, the pre-heating distance between inlet channel 43*c* and the plurality of evaporation channels 45*b* can be continuously decreasing in the direction towards fluid distributor 48*b*. This arrangement can provide a more homogenous pre-heating of the cooling fluid within inlet channel 43*b*.

Even though it is not shown in any of the Figs., the inlet channel(s), according to exemplary embodiments described herein, can further be inclined towards the inside (e.g., towards the aforesaid imaginary frontal plane) of the evaporating body, e.g., to be at an angle with respect to a thermo-conducting wall, for instance, at an angle from 0° to 45°, preferably from 10° to 35°. Thereby, in a similar manner as described above, a more homogenous pre-heating of the cooling fluid can be achieved.

Figure 8:
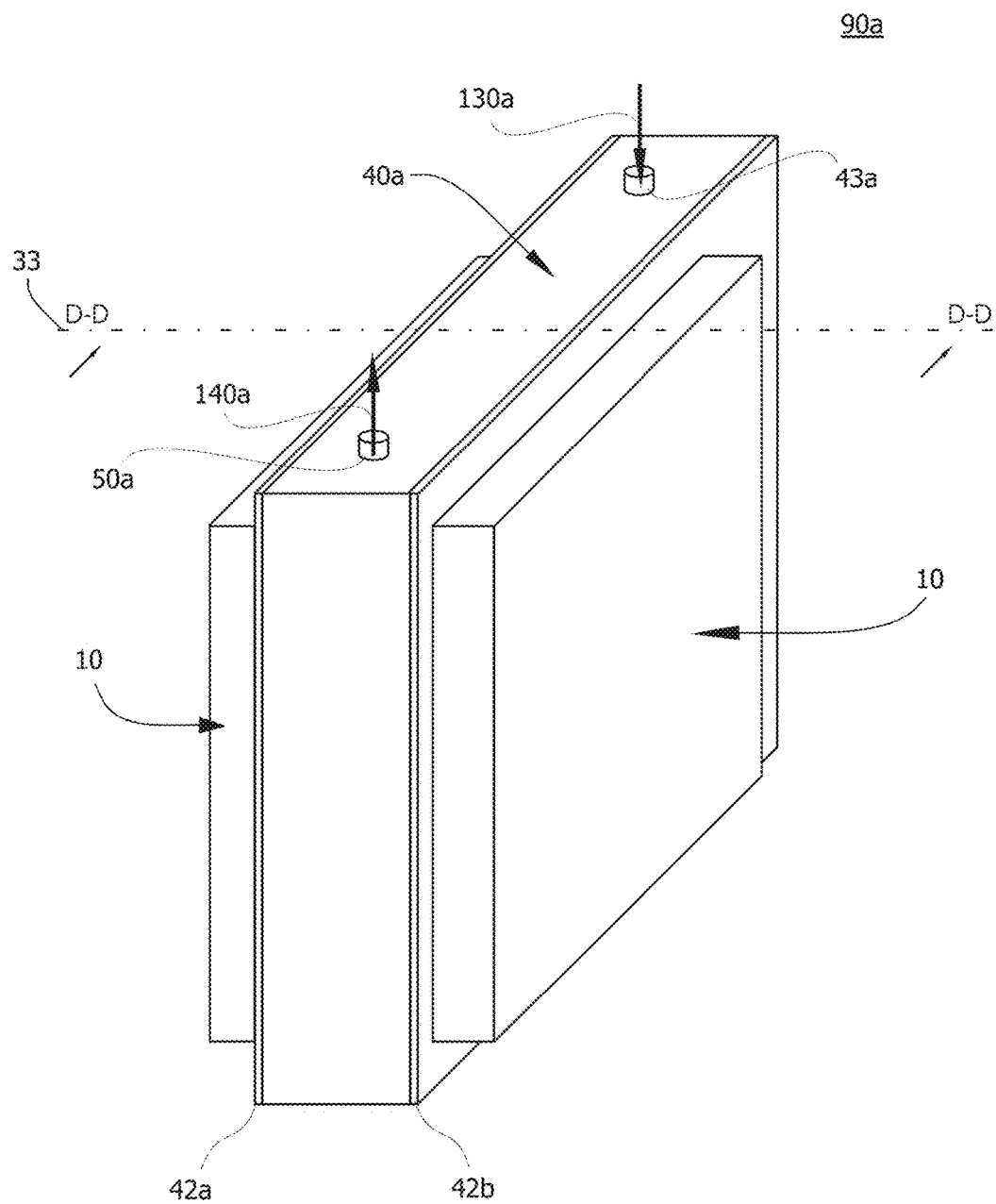
FIG. 8 schematically shows a perspective view of a power electronic module including an evaporating unit and power electronic components according to an exemplary embodiment of the present disclosure.

FIG. 8 schematically shows a perspective view of a power electronic module including an evaporating unit and power electronic components according to an exemplary embodiment of the present disclosure. As shown in FIG. 8, a perspective view of a power electronic module 90*a* including an evaporating unit 40*a* (see FIG. 3 and FIG. 4) and power electronic components or heat emitting devices 10 connected to each of the thermo-conducting walls 42*a* and 42*b* according to an embodiment herein. Heat emitting devices are dimensioned to fit onto the thermo-conducting walls 42*a* and 42*b* with no overhang and are positioned to be within the cooling surface portion 51 (described with respect to FIG. 4). According to exemplary embodiments of the present disclosure, the at least one heat emitting device can be dimensioned or positioned such that its projection on the thermo-conducting wall is equal to or extends beyond either one or both of the cooling fluid distributor and collector. The cooling fluid inflow 130*a* shows the flow of liquid cooling fluid can be from a condenser into evaporating unit 40*a*. Cooling fluid outflow 140*a* shows the flow of evaporated cooling fluid from the evaporating unit 40*a* to the condenser.

Figure 9:
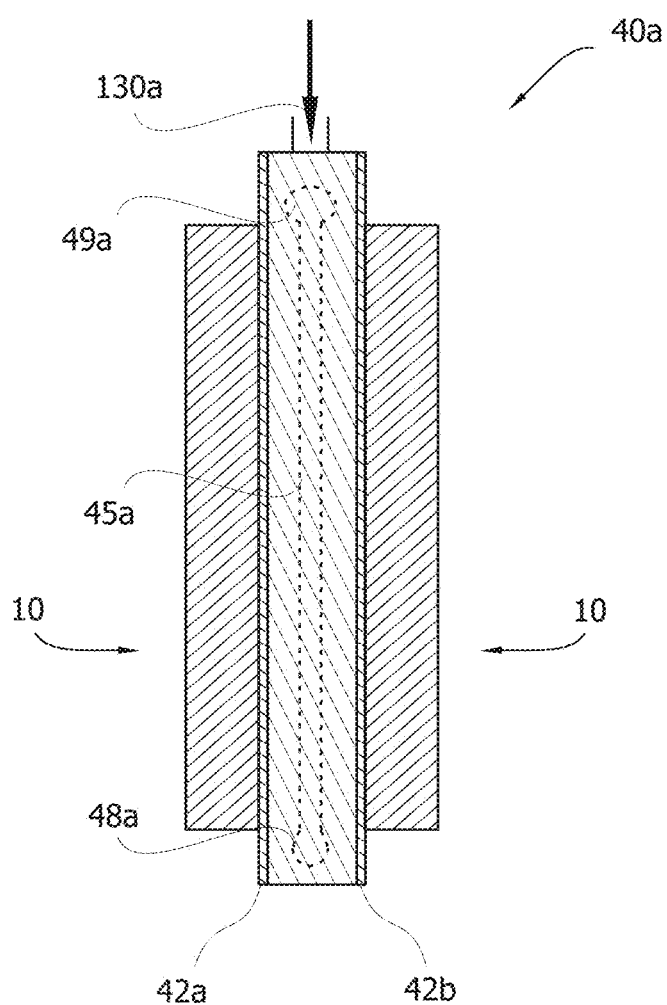
FIG. 9 schematically shows a cross-section along plane D-D of the power electronic module shown in FIG. 8 according to an exemplary embodiment of the present disclosure.

FIG. 9 schematically shows a cross-section along plane D-D of the power electronic module shown in FIG. 8 according to an exemplary embodiment of the present disclosure. As shown in FIG. 9, power electronic module 90*a* includes evaporating unit 40*a*, which includes two thermo-conducting walls 42*a*, 42*b* and a heat emitting device 10 abutting each of the thermo-conducting walls 42*a*, 42*b*. The dashed lines represent the outlines of the plurality of evaporation channels 45*a*, the fluid distributor 48*a* and fluid collector 49*a*. Furthermore, the cooling fluid inflow 130*a* shows the flow of evaporated cooling fluid from the evaporating unit 40*a* to the condenser. The end portion of cooling fluid inlet 43*a* and outlet 50*a* channels fluidly connected to the fluid distributor 48*a* and fluid collector 49*a* respectively are not shown in FIG. 9.

Figure 10:
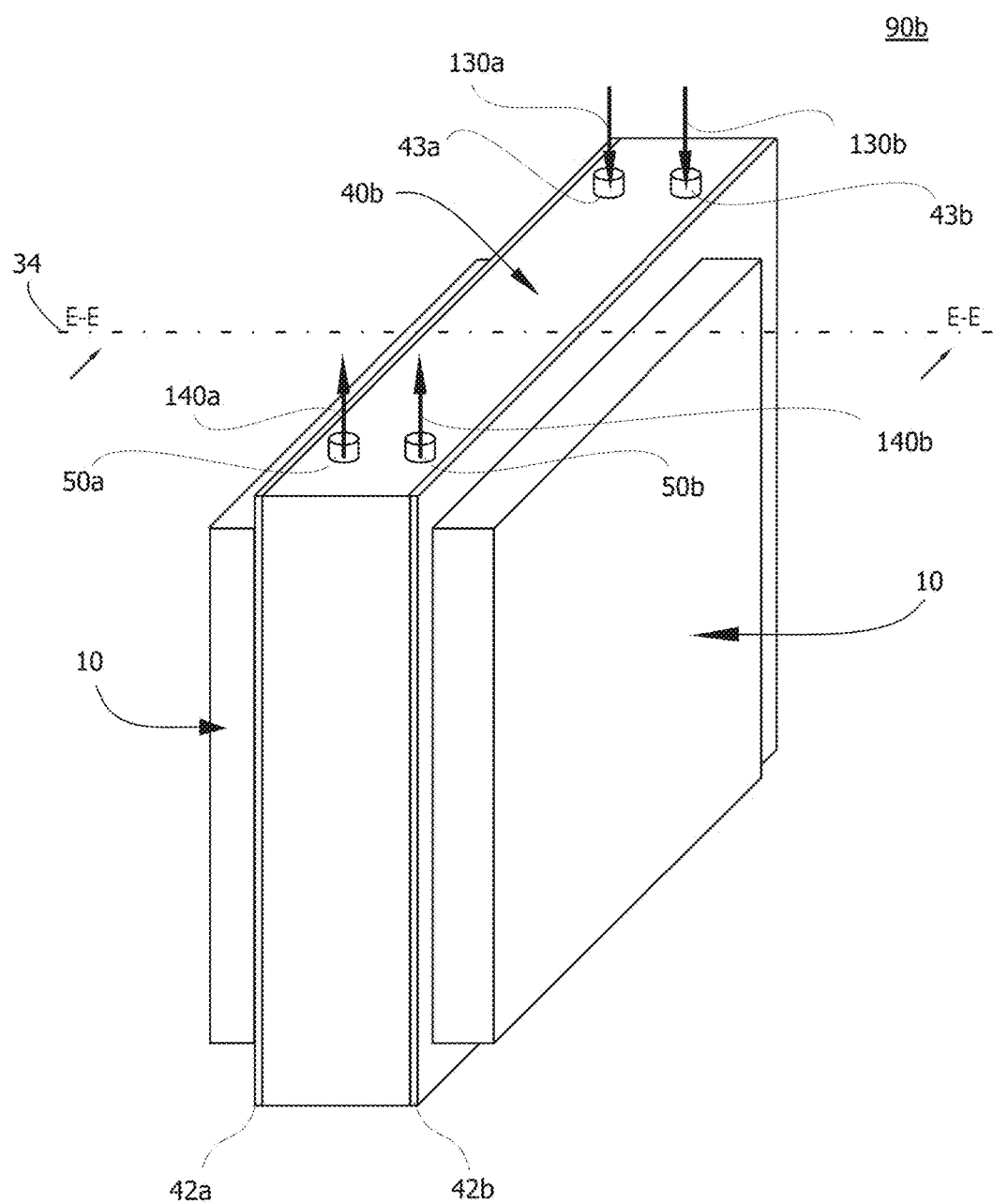
FIG. 10 schematically shows a perspective view of a power electronic module including an evaporating unit and power electronic components according to an exemplary embodiment of the present disclosure.

FIG. 10 schematically shows a perspective view of a power electronic module including an evaporating unit and power electronic components according to an exemplary embodiment of the present disclosure. For example, FIG. 10 illustrates a perspective view of a power electronic module 90*b* including an evaporating unit 40*b* (see FIG. 5 and FIG. 6) and power electronic components or heat emitting devices 10 connected to each of the thermo-conducting walls 42*a* and 42*b*. The heat emitting devices 10 can be dimensioned to fit on the thermo-conducting walls 42*a* and 42*b* respectively with no overhang and are positioned to be within the cooling surface portion 51 (e.g. as described with respect to FIG. 4). The cooling fluid inflow 130*a* and 130*b* shows the flow of liquid cooling fluid can be from a condenser into evaporating unit 40*b*. Cooling fluid outflow 140*a* and 140*b* shows the flow of evaporated cooling fluid from the evaporating unit 40*b* to the condenser.

FIG. 11 schematically shows a cross-section along plane E-E of the evaporating unit shown in FIG. 10 according to an exemplary embodiment of the present disclosure. For example, FIG. 11 illustrates power electronic module 90*b* having an evaporating unit 40*b*, which includes two thermo-conducting walls 42*a*, 42*b* and a heat emitting device 10 abutting each of the thermo-conducting walls 42*a*, 42*b*. The dashed lines represent the outlines of the plurality of evaporation channels 45*a*, 45*b* the fluid distributors 48*a*, 48*b* and fluid collectors 49*a*, 49*b*. The evaporating unit 40*b* includes a dual-core arrangement, wherein each core has a set of a plurality of evaporation channels 45*a* and 45*b* respectively. The plurality of evaporation channels 45*a*, 45*b* are connected to a corresponding fluid distributor 48*a*, 48*b*, and a corresponding fluid collector 49*a*, 49*b*. The plurality of evaporation channels 45*a*, 45*b* have a smaller diameter than the fluid distributors 42*a*, 42*b* and/or fluid collectors 49*a*, 49*b*. Furthermore, the cooling fluid inflow 130*a*, 130*b* shows the flow of evaporated cooling fluid from the evaporating unit 40*b* to the condenser.

According to exemplary embodiments of the present disclosure, a method for cooling a heat emitting device by an evaporating unit is provided. The evaporating unit can include a thermo-conducting wall, an inlet channel, a fluid distributor, a plurality of evaporation channels, a fluid collector, and an outlet channel. The heat emitting device can be connected to the thermo-conducting wall at a cooling surface portion of the evaporating unit forming a contact region there between and the inlet channel is positioned in the evaporating unit such that its projection on the thermo-conducting wall is situated outside of the aforementioned contact region. The method includes the following steps: Transferring heat from the heat emitting device via the thermo-conducting wall to the inlet channel so that the cooling fluid inside of the inlet channel is pre-heated by the heat emitting device before entering the fluid distributor; transferring heat from the heat emitting device via the thermo-conducting wall to the plurality of evaporation channels; boiling of the liquid cooling fluid in the evaporation channels, so that the cooling fluid therein is at least partially turned into vapour, thereby displaced out from the evaporation channels to the fluid collector and replaced by liquid cooling fluid entering the evaporation channels from the fluid distributor.

The method for cooling a heat emitting device can further include adjusting the heat emitting device on the thermo-conducting wall with respect to the inlet channel such that in the operating state the amount of the heat transferred from the heat emitting device to the inlet channel via the thermo-conducting wall is sufficient for heating the cooling fluid in the inlet channel at least to ±5° from its liquid-gas phase transition point. The amount of heat transferred from the heat emitting device is not enough to evaporate the cooling fluid inside of the inlet channel substantially.

The above-described systems and methods enable and favour the use of an evaporating unit with integrated pre-heater for cooling electronic components. More specifically, the inlet channel of the evaporating unit is disposed to receive thermal energy from the electronic components to pre-heat a liquid cooling fluid therein. Thereby, temperature non-uniformities in the cooling region of the evaporating unit can be avoided. For example, the formation of hot spots in the cooling region of the evaporating unit that are caused when a sub-cooled cooling fluid, which has a substantially lower heat transfer coefficient than a saturated cooling fluid, enters the cooling region can be avoided by pre-heating the liquid cooling fluid before it enters the aforesaid cooling region. Thereby, cooling efficiency of the evaporating unit can be increased. Further, damages of the electronic components by concentrated thermal energy in hot spots can be avoided, thus prolonging their life time.

Exemplary embodiments of systems and methods for cooling a plurality of electronic components by an evaporator with integrated pre-heater are described above in detail. The systems and methods are not limited to the specific exemplary embodiments described herein, but rather, components of the systems and/or steps of the methods can be utilized independently and separately from other components and/or steps described herein.

This written description uses examples to disclose the disclosure, including the best mode, and also to enable any person skilled in the art to practice the disclosure, including making and using any devices or systems and performing any incorporated methods. While various specific exemplary embodiments have been disclosed in the foregoing, those skilled in the art will recognize that the spirit and scope of the claims allows for equally effective modifications. For example, mutually non-exclusive features of the exemplary embodiments described above can be combined with each other. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal language of the claims.

Thus, it will be appreciated by those skilled in the art that the present invention can be embodied in other specific forms without departing from the spirit or essential characteristics thereof. The presently disclosed exemplary embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE NUMBERS:

heat emitting device 10
cooling circuit 20a, 20b
stack 22
clamping arrangement 25
support rod 26
plane A-A 30
plane B-B 31
plane C-C 32
plane D-D 33
plane E-E 34
evaporating unit 40a, 40b, 40c, 40d
evaporating unit body 41
thermo-conducting wall 42a, 42b
inlet channel 43a, 43b, 43c
evaporating unit core 44a, 44b
evaporation channels 45a, 45b
first ends 46a, 46b
second ends 47a, 45b
fluid distributor 48a, 48b
fluid collector 49a, 49b
outlet channel 50a, 50b
cooling surface portion 51
pre-heating distance 52
vapour riser pipe system 60
connecting vapour riser pipe 61
liquid downcomer pipe system 70
connecting liquid downcomer pipe 71
condenser 80
condenser inlet 81
condenser body 82
condenser outlet 83
power electronic module 90a, 90b
insulating portion 100
angle of inclination 110
alignment portion 120
cooling fluid inflow 130a, 130b
cooling fluid outflow 140a, 140b
flexible portion 150
electrical connection lip 160
direction of the plurality of evaporation channels 170

What is claimed is:

1. A stack of a plurality of alternating heat emitting devices and evaporating units, wherein the heat emitting devices include power electronic components, and wherein an evaporating unit is arranged for cooling at least one heat emitting device by evaporation of a cooling fluid, the evaporating unit comprising:

at least one thermo-conducting wall that is thermally connectable to the at least one heat emitting device;

a first inlet channel adapted for receiving the condensed cooling fluid from a condenser;

a first fluid distributor fluidly connected to the first inlet channel for receiving the cooling fluid therefrom, and having a volume for collecting the cooling fluid therein;

a first plurality of evaporation channels each having a first end and a second end, the first ends being fluidly connected to the first fluid distributor for receiving the cooling fluid therefrom, the first plurality of evaporation channels being in thermal contact with the at least one thermo-conducting wall such that in an operating state the cooling fluid is heated in the first plurality of evaporation channels by the heat from the at least one heat emitting device and thereby at least partially vaporized and driven out from the first plurality of evaporation channels at their second ends;

a first fluid collector fluidly connected to the second ends of the first plurality of evaporation channels for receiving the evaporated cooling fluid therefrom, and having a volume for collecting the evaporated cooling fluid therein;

a first outlet channel fluidly connected to the first fluid collector and adapted for receiving the evaporated cooling fluid therefrom, wherein the at least one thermo-conducting wall has a cooling surface portion, the cooling surface portion being a minimum convex surface portion enclosing all projections of the first plurality of evaporation channels onto the at least one thermo-conducting wall, and wherein the first inlet channel is positioned in the evaporating unit such that its projection on the at least one thermo-conducting wall is situated outside the cooling surface portion, such that in an operating state the cooling fluid inside of the first inlet channel is preheated by the at least one heat emitting device before entering the fluid collector.

2. The stack according to claim 1, wherein the first inlet channel and the first plurality of evaporation channels are arranged in a single plane.

3. The stack according to claim 1, comprising at least one of:

a second inlet channel;

a second fluid distributor;
a second plurality of evaporation channels;
a second fluid collector; and
a second outlet channel.

4. The stack according to claim 1, wherein the longitudinal axes of the first outlet channel, the first inlet channel, the first plurality of evaporation channels and the first outlet channel extend parallel to each other and perpendicular to at least one of an axes of the first fluid distributor and the first fluid collector.

5. The stack according to claim 1, wherein the first inlet channel and the first outlet channel are arranged on opposing sides of a central plane of the evaporating unit that extends parallel to the longitudinal axes of the first plurality of evaporation channels and perpendicular to a plane defined by the at least one thermo-conducting wall.

6. The stack according to claim 1, wherein the first inlet channel and the first plurality of evaporation channels are provided as openings in a single rigid body made of thermo-conducting material.

7. The stack according to claim 1, further comprising:
at least two alignment portions defined by a cutaway portion on at least two opposing sides of the evaporating unit, for accommodating support rods that provide fixation and support to a stack of a plurality of alternating heat emitting devices and evaporating units.

8. The stack according to claim 1, wherein the evaporating unit includes two thermo-conducting walls provided on mutually opposite sides of the evaporating unit, the thermo-conducting walls being adapted to be in thermal contact with two heat emitting devices.

9. The stack according to claim 2, comprising at least one of:
a second inlet channel;
a second fluid distributor;
a second plurality of evaporation channels;
a second fluid collector; and
a second outlet channel.

10. The stack according to claim 2, wherein the longitudinal axes of the first outlet channel, the first inlet channel, the first plurality of evaporation channels and the first outlet channel extend parallel to each other and perpendicular to at least one of an axes of the first fluid distributor and the first fluid collector.

11. The stack according to claim 2, wherein the first inlet channel and the first outlet channel are arranged on opposing sides of a central plane of the evaporating unit that extends parallel to the longitudinal axes of the first plurality of evaporation channels and perpendicular to a plane defined by the at least one thermo-conducting wall.

12. The stack according to claim 2, wherein the first inlet channel and the first plurality of evaporation channels are provided as openings in a single rigid body made of thermo-conducting material.

13. The stack according to claim 2, further comprising:
at least two alignment portions defined by a cutaway portion on at least two opposing sides of the evaporating unit, for accommodating support rods that provide fixation and support to a stack of a plurality of alternating heat emitting devices and evaporating units.

14. The stack according to claim 2, wherein the evaporating unit includes two thermo-conducting walls provided on mutually opposite sides of the evaporating unit, the thermo-conducting walls being adapted to be in thermal contact with two heat emitting devices.

15. A method for cooling at least one heat emitting device by at least one evaporating unit, the at least one evaporating unit including at least one thermo-conducting wall, a first inlet channel, a first fluid distributor, a first plurality of evaporation channels, a first fluid collector, and a first outlet channel, wherein the at least one heat emitting device is connected to the at least one thermo-conducting wall at a cooling surface portion of the at least one evaporating unit forming a contact region there between, and wherein the first inlet channel is positioned in the at least one evaporating unit such that its projection on the at least one thermo-conducting wall is situated outside of said contact region, the method comprising:

transferring heat from the at least one heat emitting device via the at least one thermo-conducting wall to the first inlet channel so that the cooling fluid inside of the first inlet channel is pre-heated by the at least one heat emitting device before entering the first fluid distributor;

transferring heat from the at least one heat emitting device via the at least one thermo-conducting wall to the first plurality of evaporation channels; and boiling of the liquid cooling fluid in the first plurality of evaporation channels, so that the cooling fluid therein is at least partially vaporized, thereby displaced out from the first plurality of evaporation channels to the first fluid collector and replaced by liquid cooling fluid entering the first plurality of evaporation channels from the first fluid distributor.

16. The method according to claim 15, wherein the position of the at least one heat emitting device on the at least one thermo-conducting wall is adjusted with respect to the first inlet channel such that in the operating state the amount of heat transferred from the at least one heat emitting device to the first inlet channel via the at least one thermo-conducting wall is sufficient for heating the cooling fluid in the first inlet channel at least to −5° C. from its liquid-gas phase transition point.

* * * * *